US012751163B2

(12) United States Patent
Choi

(10) Patent No.: US 12,751,163 B2
(45) Date of Patent: Sep. 29, 2026

(54) DISPLAY DEVICE AND METHOD OF MANUFACTURING THE SAME

(71) Applicant: Samsung Display Co., LTD., Yongin-si (KR)

(72) Inventor: Jonghyun Choi, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 382 days.

(21) Appl. No.: 18/452,399

(22) Filed: Aug. 18, 2023

(65) Prior Publication Data

US 2024/0237439 A1 Jul. 11, 2024

(30) Foreign Application Priority Data

Jan. 11, 2023 (KR) ........................ 10-2023-0003886

(51) Int. Cl.
*H10K 59/131* (2023.01)
*H10K 59/12* (2023.01)
*H10K 71/20* (2023.01)

(52) U.S. Cl.
CPC ....... *H10K 59/131* (2023.02); *H10K 59/1201* (2023.02); *H10K 71/231* (2023.02)

(58) Field of Classification Search
CPC ............. H10K 59/131; H10K 59/1201; H10K 71/231; H10K 59/873; H10K 59/121; H10K 59/1213; H10K 59/124; H10K 59/122; H10K 59/123; H10K 50/14; H10K 50/17; H10K 59/60; H10K 59/8051; H10K 59/80521; H10K 77/10; H10D 86/40; H10D 86/60; H10D 30/6743; H10D 30/6755
See application file for complete search history.

(56) References Cited

U.S. PATENT DOCUMENTS

| | | | | |
|---|---|---|---|---|
| 9,905,629 | B2 | 2/2018 | Kim et al. | |
| 10,205,122 | B2 | 2/2019 | Choi et al. | |
| 2019/0181205 | A1* | 6/2019 | Kim | H10D 86/451 |
| 2019/0198534 | A1* | 6/2019 | Je | H10D 86/60 |
| 2020/0303478 | A1 | 9/2020 | Lee et al. | |

(Continued)

FOREIGN PATENT DOCUMENTS

| | | | |
|---|---|---|---|
| CN | 109802052 | A | 5/2019 |
| CN | 110690264 | A | 1/2020 |
| CN | 110767735 | A | 2/2020 |

*Primary Examiner* — Bitew A Dinke
(74) *Attorney, Agent, or Firm* — Womble Bond Dickinson (US) LLP

(57) ABSTRACT

A display device includes: a substrate having a transmission area, a display area, and an intermediate area between the transmission and display areas; a first active layer including a first active pattern; a first conductive layer on the first active layer and including a gate electrode overlapping the first active pattern; a second active layer on the first conductive layer and including a second active pattern; a second conductive layer between the first conductive layer and the second active layer; a third conductive layer on the second conductive layer and including a bridge electrode electrically connecting the gate electrode and the second active pattern; a first sub-layer in the intermediate area and on a same layer as the second conductive layer; and a second sub-layer covering an outer surface of the first sub-layer. The first and second sub-layers have connected first and second sub-openings, respectively.

27 Claims, 15 Drawing Sheets

(56) References Cited

U.S. PATENT DOCUMENTS

| | | | | |
|---|---|---|---|---|
| 2020/0403180 | A1* | 12/2020 | Seon | H10K 59/8731 |
| 2021/0202653 | A1* | 7/2021 | Cho | H10K 71/00 |
| 2021/0242291 | A1* | 8/2021 | Jeon | H10K 59/131 |
| 2021/0249498 | A1* | 8/2021 | Cho | H10D 86/481 |
| 2021/0343810 | A1 | 11/2021 | You | |
| 2022/0020960 | A1* | 1/2022 | Choi | H10K 59/122 |
| 2022/0052140 | A1* | 2/2022 | Choi | H10K 59/121 |
| 2022/0123075 | A1* | 4/2022 | Kim | G06F 1/1605 |
| 2022/0209187 | A1 | 6/2022 | Bok et al. | |
| 2022/0209208 | A1* | 6/2022 | Kang | H10D 86/60 |
| 2022/0310972 | A1* | 9/2022 | Park | H10K 59/40 |
| 2023/0216002 | A1* | 7/2023 | Yi | H10H 20/853<br>257/79 |

* cited by examiner

DISPLAY DEVICE AND METHOD OF MANUFACTURING THE SAME

CROSS-REFERENCED TO RELATED APPLICATION

This application claims priority to and the benefit of Korean Patent Application No. 10-2023-0003886, filed on Jan. 11, 2023, in the Korean Intellectual Property Office, the entire content of which is incorporated herein by reference.

BACKGROUND

1. Field

Aspects of embodiments of the present disclosure relate to a display device and method of manufacturing the display device.

2. Description of the Related Art

An electronic element (e.g., a camera, etc.) may be disposed in a display device so that user can perform various functions using the display device. For the electronic element to function efficiently, the transmittance of external light incident on the electronic element should be increased. Also, recently, to enlarge a display area of the display device, a structure in which the electronic element is arranged to overlap the display area has been developed.

SUMMARY

Embodiments of the present disclosure provide a display device exhibiting improved manufacturing process efficiency.

Embodiments of the present disclosure also provide a method for manufacturing the display device.

A display device, according to an embodiment of the present disclosure, includes: a substrate having a transmission area, a display area extending around a periphery of the transmission area, and an intermediate area between the transmission area and the display area; a first active layer on the substrate and including a first active pattern in the display area; a first conductive layer on the first active layer and including a gate electrode overlapping the first active pattern; a second active layer on the first conductive layer and including a second active pattern in the display area; a second conductive layer between the first conductive layer and the second active layer; a third conductive layer on the second conductive layer and including a bridge electrode electrically connecting the gate electrode and the second active pattern; a first sub-layer in the intermediate area and on a same layer as the second conductive layer; and a second sub-layer in the intermediate area and covering an outer surface of the first sub-layer. The first sub-layer having a first sub-opening, and the second sub-layer having a second sub-opening connected to the first sub-opening.

The display device may further include an upper insulating layer on the third conductive layer and the second sub-layer and covering the bridge electrode. The first sub-opening and the second sub-opening may be interconnected to define a metal opening, and the upper insulating layer may have an insulating opening connected to the metal opening.

The metal opening and the insulating opening may be interconnected to define a groove, and an inner surface of the metal opening may be more recessed in a direction away from a center of the groove than an inner surface of the insulating opening.

The display device may further include a lower insulating layer under the second conductive layer and the first sub-layer and having a trench connected to the metal opening to form the groove.

The groove may be axisymmetric with respect to a central axis of the groove.

The groove may be asymmetrical with respect to a central axis of the groove.

The display device may further include a light emitting device in the display area and including an anode electrode, a cathode electrode, and an intermediate layer between the anode electrode and the cathode electrode, and the cathode electrode may be disconnected by the groove.

The intermediate layer may include an emission layer, a first functional layer between the anode electrode and the emission layer, and a second functional layer between the emission layer and the cathode electrode, and at least one of the first functional layer and the second functional layer may be disconnected by the groove.

The first active pattern may include a silicon semiconductor, and the second active pattern may include an oxide semiconductor.

The second conductive layer and the first sub-layer may include a same material, and the third conductive layer and the second sub-layer may include a same material.

The display device may further include: a fourth conductive layer on the third conductive layer and including a first connection electrode contacting the first active pattern; a second connection electrode contacting the second active pattern; and a fifth conductive layer on the fourth conductive layer and including a third connection electrode contacting the first connection electrode.

A display device, according to another embodiment of the present disclosure, includes: a substrate having a transmission area, a display area extending around a periphery of the transmission area, and an intermediate area between the transmission area and the display area; a first active layer on the substrate and including a first active pattern in the display area; a first conductive layer on the first active layer and including a gate electrode overlapping the first active pattern; a second active layer on the first conductive layer and including a second active pattern in the display area; a second conductive layer between the first conductive layer and the second active layer; a third conductive layer on the second conductive layer and including a bridge electrode electrically connecting the gate electrode and the second active pattern; a first sub-layer in the intermediate area and on a same layer as the first conductive layer; and a second sub-layer in the intermediate area and covering an outer surface of the first sub-layer. The first sub-layer has a first sub-opening, the second sub-layer has a second sub-opening connected to the first sub-opening.

The display device may further include an upper insulating layer on the third conductive layer and the second sub-layer and covering the bridge electrode. The first sub-opening and the second sub-opening may be interconnected to define a metal opening, and the upper insulating layer may have an insulating opening connected to the metal opening.

The metal opening and the insulating opening may be interconnected to define a groove, and an inner surface of the metal opening may be more recessed in a direction away from a center of the groove than an inner surface of the insulating opening.

The first conductive layer and the first sub-layer may include a same material, and the third conductive layer and the second sub-layer may include a same material.

A method of manufacturing a display device, according to an embodiment of the present disclosure, includes: forming a first active layer including a first active pattern in a display area on a substrate, the substrate having a transmission area, the display area extending around a periphery of the transmission area, and an intermediate area between the transmission area and the display area; forming a first conductive layer including a gate electrode overlapping the first active pattern on the first active layer; forming a second active layer on the first conductive layer and including a second active pattern; forming a second conductive layer between the first conductive layer and the second active layer; forming a third conductive layer on the second conductive layer and including a bridge electrode electrically connecting the gate electrode and the second active pattern; forming a first sub-layer in the intermediate area and on the first active layer; forming a second sub-layer in the intermediate area and covering an outer surface of the first sub-layer; forming an upper insulating layer having an insulating opening exposing a portion of the second sub-layer on the third conductive layer and the second sub-layer; exposing a portion of the first sub-layer by removing the second sub-layer exposed from the upper insulating layer; and removing the first sub-layer exposed from the second sub-layer.

The forming of the first sub-layer may be performed together with any one of the forming of the second conductive layer and the forming of the second conductive layer.

The forming of the second sub-layer and the forming of the third conductive layer may be concurrently performed in a same process.

During the removing of the first sub-layer, a portion of the second sub-layer may be removed together therewith.

The method may further include: forming a fourth conductive layer on the third conductive layer and including a first connection electrode contacting the first active pattern and a second connection electrode contacting the second active pattern; forming a fifth conductive layer on the fourth conductive layer and including a third connection electrode contacting the first connection electrode; and forming an anode electrode on the fifth conductive layer and contacting the third connection electrode. The forming of the fourth conductive layer, the forming of the fifth conductive layer, and the forming of the anode electrode may be performed after the forming of the upper insulating layer.

The forming of the fourth conductive layer may include forming a first preliminary conductive layer on the upper insulating layer and removing a portion of the first preliminary conductive layer, and the removing of the second sub-layer may be performed together with the removing of the portion of the first preliminary conductive layer.

The removing of the portion of the first preliminary conductive layer may be performed by a dry etching process.

The forming of the fifth conductive layer may include forming a second preliminary conductive layer on the upper insulating layer and removing a portion of the second preliminary conductive layer, and the removing of the second sub-layer may be performed together with the removing of the portion of the second preliminary conductive layer.

The removing of the portion of the second preliminary conductive layer may be performed by a dry etching process.

The forming of the anode electrode may include forming a third preliminary conductive layer on the upper insulating layer and removing a portion of the third preliminary conductive layer, and the removing of the first sub-layer may be performed together with the removing of the portion of the third preliminary conductive layer.

The removing of the portion of the third preliminary conductive layer may be performed by a wet etching process.

After the removing of the first sub-layer, the first sub-layer may have a first sub-opening, the second sub-layer may have a second sub-opening connected to the first sub-opening, the first sub-opening and the second sub-opening may be interconnected to define a metal opening. The metal opening and the insulating opening may be interconnected to define a groove.

The method may further include forming a trench connected to the metal opening by removing a portion of a lower insulating layer disposed under the first sub-layer, and the forming of the trench may be performed after the removing the first sub-layer.

The display device, according to embodiments of the present disclosure, may include a metal layer in an intermediate area between a transmission area and a display area and an upper insulating layer on the metal layer, and a metal opening penetrating the metal layer and an insulating opening penetrating the upper insulating layer may be interconnected to define a groove in the intermediate area.

Each of the metal layer, the upper insulating layer, and the groove may be formed in (e.g., concurrently with) several processes for forming components in the display area. Accordingly, a separate process for forming the groove may not be required. Thus, efficiency of the manufacturing process of the display device may be improved.

It is to be understood that both the foregoing general description and the following detailed description are exemplary and explanatory in nature and are intended to explain aspects and features of the present disclosure.

BRIEF DESCRIPTION OF THE DRAWINGS

Aspects and features of the present disclosure will be more clearly understood from the following detailed description, taken in conjunction with the accompanying drawings, in which.

DETAILED DESCRIPTION

Figure 1:
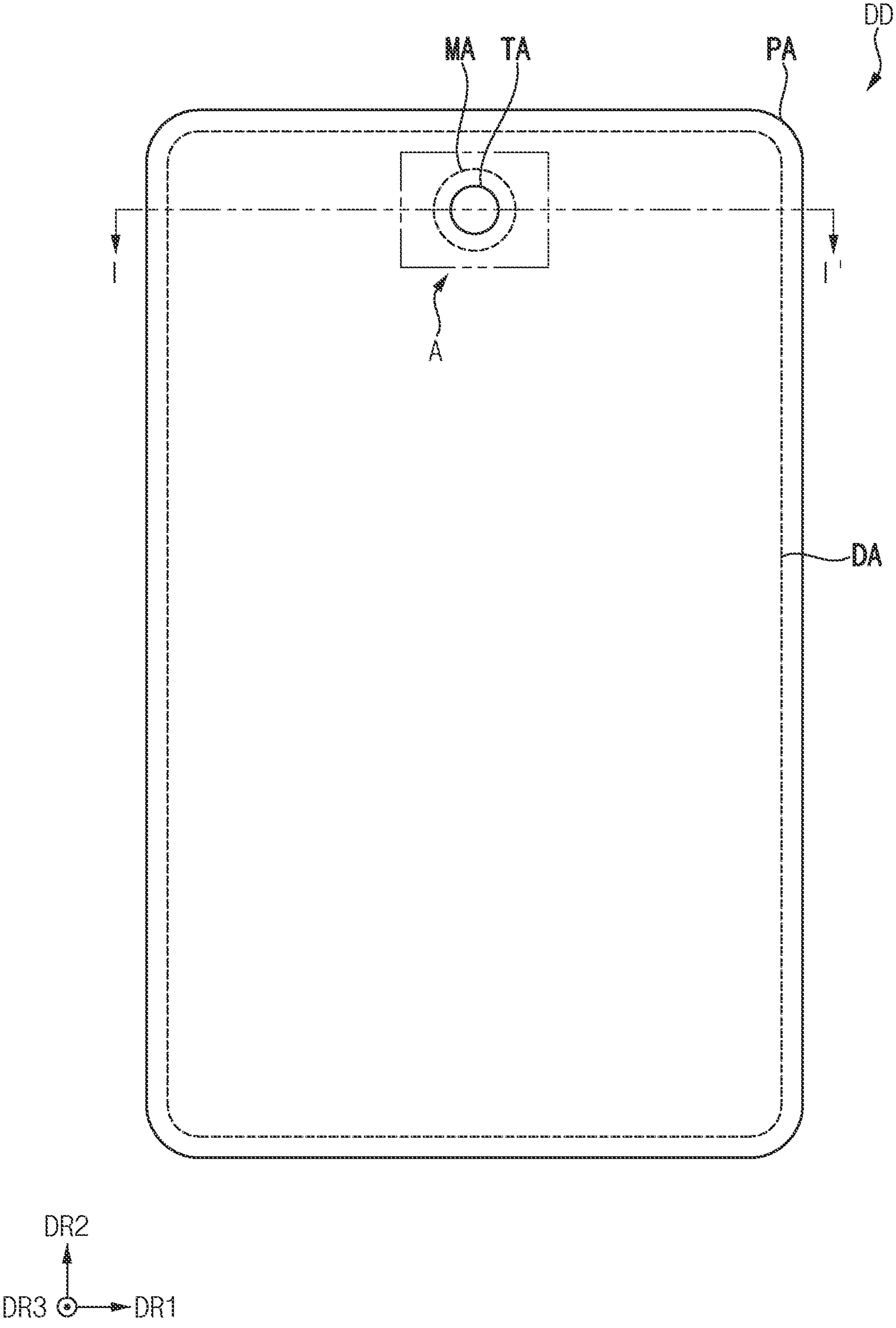
FIG. 1 is a plan view illustrating a display device according to an embodiment.

The present disclosure will be described more fully hereinafter with reference to the accompanying drawings, in which various embodiments are shown. The present disclosure may, however, be embodied in many different forms and should not be construed as limited to the embodiments set forth herein. Rather, these embodiments are provided so that this disclosure will be thorough and complete and will fully convey the scope of the present disclosure to those skilled in the art.

It will be understood that when an element or layer is referred to as being "on," "connected to," or "coupled to" another element or layer, it may be directly on, connected, or coupled to the other element or layer or one or more intervening elements or layers may also be present. When an element or layer is referred to as being "directly on," "directly connected to," or "directly coupled to" another element or layer, there are no intervening elements or layers present. For example, when a first element is described as being "coupled" or "connected" to a second element, the first element may be directly coupled or connected to the second element or the first element may be indirectly coupled or connected to the second element via one or more intervening elements.

In the figures, dimensions of the various elements, layers, etc. may be exaggerated for clarity of illustration. The same reference numerals designate the same elements. As used herein, the term "and/or" includes any and all combinations of one or more of the associated listed items. Further, the use of "may" when describing embodiments of the present disclosure relates to "one or more embodiments of the present disclosure." Expressions, such as "at least one of" and "any one of," when preceding a list of elements, modify the entire list of elements and do not modify the individual elements of the list. For example, the expression "at least one of a, b, or c" indicates only a, only b, only c, both a and b, both a and c, both b and c, all of a, b, and c, or variations thereof. As used herein, the terms "use," "using," and "used" may be considered synonymous with the terms "utilize," "utilizing," and "utilized," respectively. As used herein, the terms "substantially," "about," and similar terms are used as terms of approximation and not as terms of degree, and are intended to account for the inherent variations in measured or calculated values that would be recognized by those of ordinary skill in the art.

It will be understood that, although the terms first, second, third, etc. may be used herein to describe various elements, components, regions, layers, and/or sections, these elements, components, regions, layers, and/or sections should not be limited by these terms. These terms are used to distinguish one element, component, region, layer, or section from another element, component, region, layer, or section. Thus, a first element, component, region, layer, or section discussed below could be termed a second element, component, region, layer, or section without departing from the teachings of example embodiments.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly.

The terminology used herein is for the purpose of describing embodiments of the present disclosure and is not intended to be limiting of the present disclosure. As used herein, the singular forms "a" and "an" are intended to include the plural forms as well, unless the context clearly indicates otherwise. It will be further understood that the terms "includes," "including," "comprises," and/or "comprising," when used in this specification, specify the presence of stated features, integers, steps, operations, elements, and/or components but do not preclude the presence or addition of one or more other features, integers, steps, operations, elements, components, and/or groups thereof.

FIG. 1 is a plan view illustrating a display device according to an embodiment.

Referring to FIG. 1, a display device DD (e.g., a substrate SUB shown in FIG. 5) may have a transmission area TA and a display area DA surrounding (e.g., extending around a periphery of or surrounding in a plan view) the transmission area TA. A plurality of pixels may be disposed in the display area DA, and an image may be displayed through the pixels in the display area DA. The transmission area TA may be entirely surrounded by (e.g., may be within) the display area DA.

An intermediate area MA may be provided between the transmission area TA and the display area DA. The intermediate area MA is an area at where the pixels are not disposed and wires bypassing the transmission area TA may be disposed.

Also, the display device DD may have a peripheral area PA. The peripheral area PA may be positioned around the display area DA. For example, the peripheral area PA may surround (e.g., may extend around a periphery of or may surround in a plan view) the display area DA. A plurality of drivers may be disposed in the peripheral area PA to provide driving signals to the pixels.

In an embodiment, the display device DD may have a rectangular shape with rounded corners in a plan view. However, the present disclosure is not limited thereto, and the display device DD may have various shapes in a plan view. A plane may be defined by a first direction DR1 and a second direction DR2 crossing (e.g., intersecting) the first direction DR1. The third direction DR3 may be perpendicular to the plane.

In FIG. 1, the transmission area TA is illustrated as being disposed in a center of an upper side (or an upper end) of the display device DD, but the present disclosure is not limited thereto. In other embodiments, the transmission area TA may be disposed in various locations in the display area DA.

In addition, although the display device DD is illustrated as having one transmission area TA in FIG. 1, the present disclosure is not limited thereto. In other embodiments, the display device DD may have two or more transmission areas.

Figure 2:
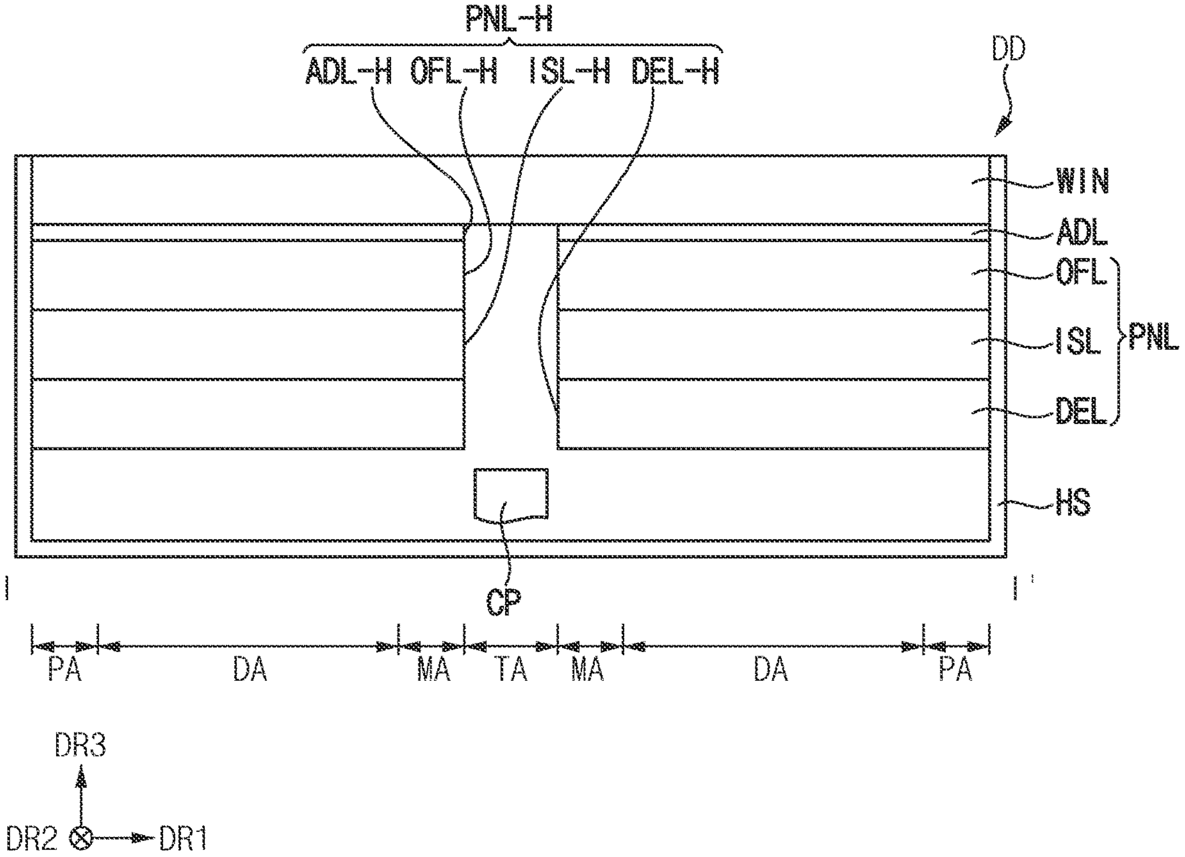
FIG. 2 is a cross-sectional view taken along line the I-I' of FIG. 1.

FIG. 2 is a cross-sectional view taken along the line I-I' of FIG. 1.

Referring to FIGS. 1 and 2, the display device DD may include a display panel PNL, a window WIN, and a component CP. The display panel PNL may include a display element layer DEL, an input sensing layer ISL, and an optical function layer OFL. In an embodiment, the display panel PNL, the window WIN, and the component CP may be accommodated in a housing HS. In another embodiment, the housing HS may be omitted.

The display element layer DEL may include a light emitting device for emitting light. In an embodiment, the light emitting device may be an organic light emitting diode including an organic material. However, the present disclosure is not limited thereto, and in other embodiments, the light emitting device may be an inorganic light emitting diode including an inorganic material or a quantum dot light emitting diode including quantum dots. Hereinafter, for convenience of description, an embodiment in which the light emitting device is an organic light emitting diode will be primarily described.

The input sensing layer ISL may obtain information according to an external input (e.g., a user's touch). The input sensing layer ISL may include a sensing electrode and a signal line connected to the sensing electrode. In an embodiment, the input sensing layer ISL may be disposed on the display element layer DEL.

The input sensing layer ISL may be directly formed on the display element layer DEL or may be separately formed and then bonded thereto by an adhesive layer. Although the input sensing layer ISL is shown in FIG. 2 as being disposed between the display element layer DEL and the optical function layer OFL, the present disclosure is not limited thereto. In another embodiment, the input sensing layer ISL may be disposed on the optical function layer OFL.

The optical function layer OFL may include an anti-reflection layer. The anti-reflection layer may reduce reflectance of light incident from the outside through the window WIN (e.g., external light). In an embodiment, the anti-reflection layer may include a phase retarder and a polarizer. In another embodiment, the anti-reflection layer may include a black matrix and color filters. The color filters may be arranged in consideration of a color of light emitted from each of the light emitting devices in the display element layer DEL. Each of the color filters may include a red, green, or blue pigment or dye. Each of the color filters may further include quantum dots in addition to the aforementioned pigments or dyes. Also, some of the color filters may not include the aforementioned pigments or dyes and may include scattering particles, such as titanium oxide.

To improve transmittance of the transmission area TA, a panel opening PNL-H may be defined in the display panel PNL passing through at least some of the layers constituting the display panel PNL. For example, the panel opening PNL-H may include first to third openings DEL-H, ISL-H, and OFL-H passing through the display element layer DEL, the input sensing layer ISL, and the optical functional layer OFL, respectively. For example, the first opening DEL-H, the second opening ISL-H, and the third opening OFL-H may be connected to (e.g., may be open to) each other to define the panel opening PNL-H.

The window WIN may be disposed on the optical function layer OFL. The window WIN may include glass or plastic. For example, the window WIN may include ultra-thin glass (UTG).

In an embodiment, an adhesive layer ADL may be disposed between the window WIN and the optical function layer OFL. For example, the window WIN may be bonded to the display panel PNL through the adhesive layer ADL. The adhesive layer ADL may have an adhesive layer opening ADL-H overlapping the panel opening PNL-H. In another embodiment, the adhesive layer ADL may be omitted.

The component CP may be disposed in the transmission area TA. That is, the transmission area TA may be an area at where the component CP for adding various functions to the display device DD is located.

The component CP may include electronic elements. For example, the component CP may be an electronic element using (or interpreting) light or sound. For example, the electronic elements may include a sensor that uses light, such as an infrared sensor, a camera that receives light to capture an image, a sensor that outputs and detects light or sound to measure distance or recognizes a fingerprint, a small lamp that outputs light, and a speaker that outputs sound.

In an embodiment, when the display device DD is used as a smart watch or a dashboard for a vehicle, the component CP may be a member including a clock hand or a needle indicating information (e.g., vehicle speed, etc.). When the display device DD includes a clock hand or an instrument panel for a vehicle, the component CP may penetrate the window WIN to be exposed to the outside, and the window WIN may have an opening overlapping the panel opening PNL-H.

Figure 3:
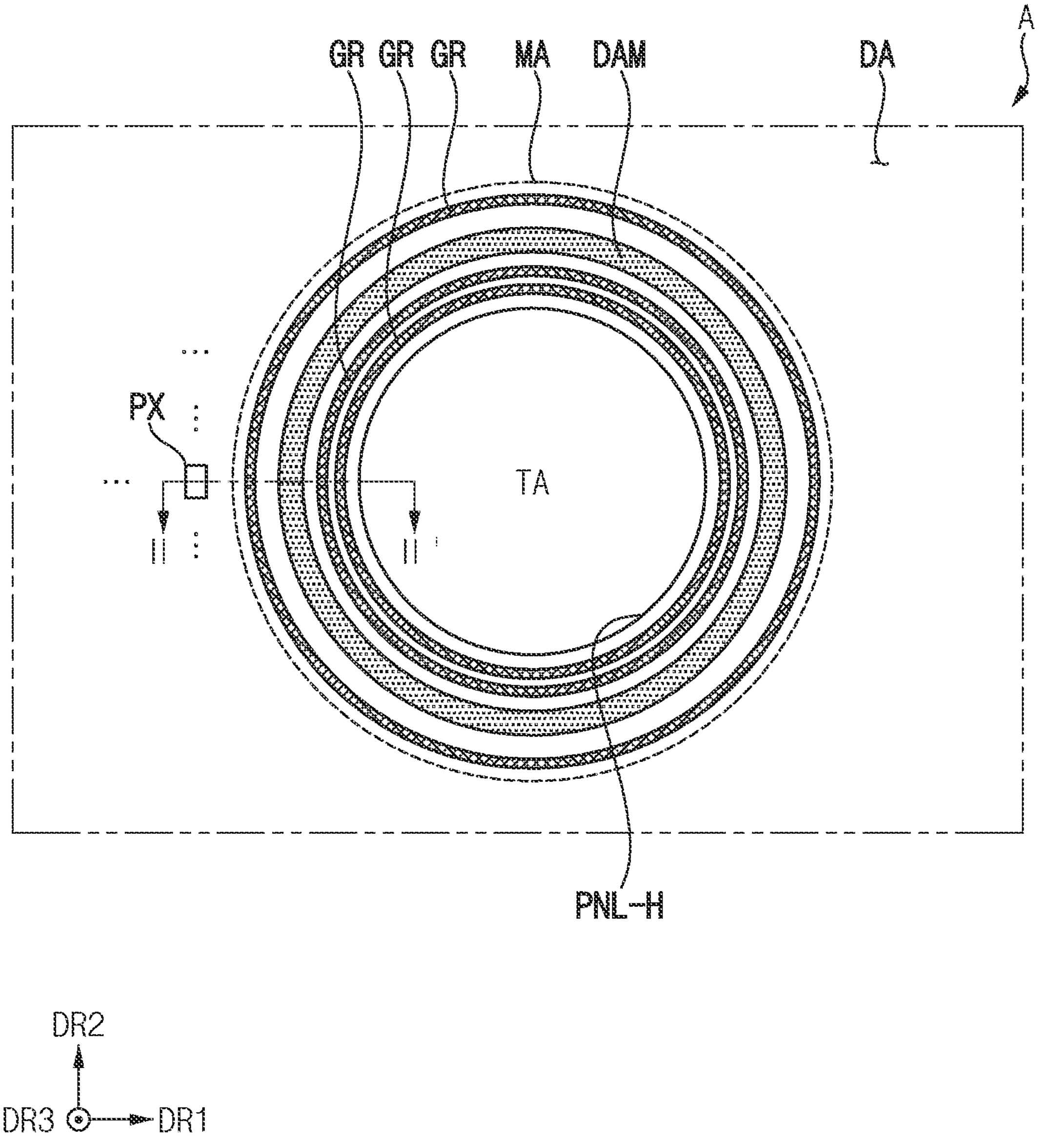
FIG. 3 is an enlarged view of the area A of FIG. 1.

FIG. 3 is an enlarged view of the area A of FIG. 1.

Referring to FIGS. 1 to 3, the display device DD may have the display area DA, the transmission area TA, and the intermediate area MA between the display area DA and the transmission area TA.

In an embodiment, the intermediate area MA may surround the transmission area TA. At least one groove and at least one dam may be formed in the intermediate area MA. For example, a groove GR and a dam DAM surrounding the transmission area TA may be disposed in the intermediate area MA. The groove GR and the dam DAM may be arranged in a ring shape, and the groove GR and the dam DAM may be spaced apart from each other.

The groove GR may block moisture and foreign substances penetrating into the display area DA from reaching the transmission area TA. In addition, the dam DAM may prevent an organic encapsulation layer disposed in the display area DA from overflowing into the transmission area TA. The groove GR and the dam DAM will be described in more detail with reference to FIG. 5.

Although three grooves GR and one dam DAM are illustrated in the intermediate area MA in the embodiment shown in FIG. 3, the present disclosure is not limited thereto. In another embodiment, one or more than four grooves GR may be disposed in the intermediate region MA, and two or more dams DAM may be disposed in the intermediate area MA.

A pixel PX may be disposed in the display area DA surrounding the intermediate area MA. As described above, the pixel PX may emit light and may be provided in plurality in the display area DA. By combining the light emitted from the plurality of pixels, an image may be displayed in the display area DA.

Figure 4:
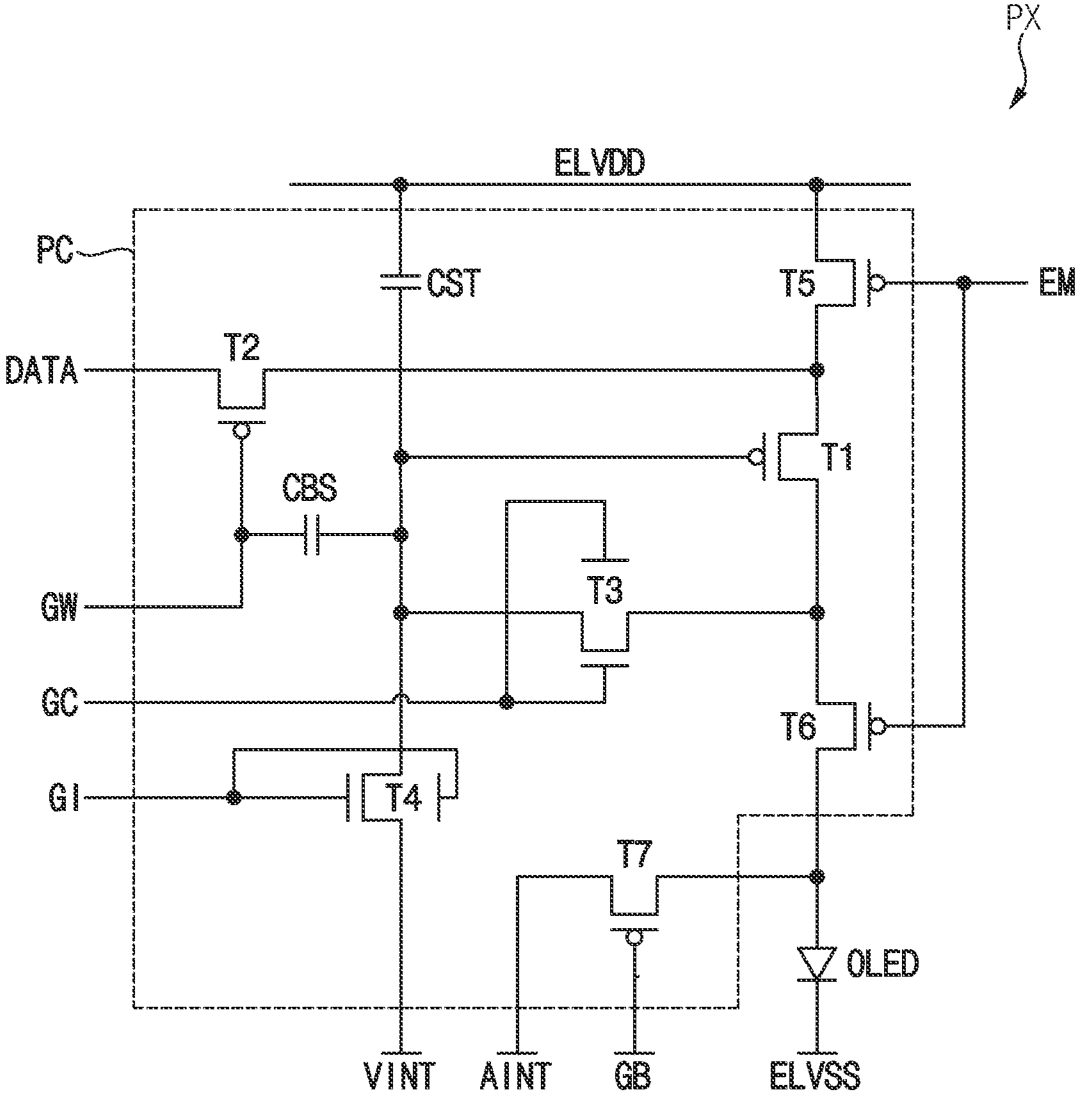
FIG. 4 is a schematic circuit diagram illustrating a pixel included in the display device shown in FIG. 3.

FIG. 4 is a schematic circuit diagram illustrating a pixel included in the display device shown in FIGS. 1-3.

Referring to FIG. 4, the pixel PX may include a pixel circuit PC and an organic light emitting diode OLED. The pixel circuit PC may provide driving current to the organic light emitting diode OLED. The organic light emitting diode OLED may generate light based on the driving current.

The pixel circuit PC may include a first transistor T1, a second transistor T2, a third transistor T3, a fourth transistor T4, a fifth transistor T5, a sixth transistor T6, and a seventh transistor T7, a storage capacitor CST, and a boosting capacitor CBS.

The organic light emitting diode OLED may have a first terminal (e.g., an anode) and a second terminal (e.g., a cathode). The first terminal of the organic light emitting diode OLED may be connected to the sixth transistor T6 and the seventh transistor T7, and the second terminal of the organic light emitting diode OLED may receive a common voltage ELVSS. The organic light emitting diode OLED may generate light having a luminance corresponding to the driving current.

The storage capacitor CST may have a first terminal and a second terminal. The first terminal of the storage capacitor CST may be connected to the first transistor T1, and the second terminal of the storage capacitor CST may receive a driving voltage ELVDD. The storage capacitor CST may maintain a voltage level of a gate terminal of the first transistor T1 during an inactive period of a first gate signal GW.

The boosting capacitor CBS may have a first terminal and a second terminal. The first terminal of the boosting capacitor CBS may be connected to the gate terminal of the first transistor T1, and the second terminal of the boosting capacitor CBS may receive the first gate signal GW. The boosting capacitor CBS may compensate for a voltage drop at the gate terminal of the first transistor T1 by increasing the voltage of the gate terminal of the first transistor T1 at a point in time when a supply of the first gate signal GW is stopped.

The first transistor T1 may have the gate terminal, a first terminal, and a second terminal. The gate terminal of the first transistor T1 may be connected to the first terminal of the storage capacitor CST. The first terminal of the first transistor T1 may be connected to the second transistor T2 to receive a data voltage DATA. The second terminal of the first transistor T1 may be connected to the sixth transistor T6. The first transistor T1 may generate the driving current based on a voltage difference between the gate terminal and the first terminal thereof.

The second transistor T2 may have a gate terminal, a first terminal, and a second terminal. The gate terminal of the second transistor T2 may receive the first gate signal GW.

The second transistor T2 may be turned on or off in response to the first gate signal GW. For example, when the second transistor T2 is a p-channel metal oxide semiconductor (PMOS), the second transistor T2 may be turned off when the first gate signal GW has a positive voltage level and may be turned on when the first gate signal GW has a negative voltage level. The first terminal of the second transistor T2 may receive the data voltage DATA. The second terminal of the second transistor T2 may provide the data voltage DATA to the first terminal of the first transistor T1 while the second transistor T2 is turned on.

The third transistor T3 may have a gate terminal, a lower gate terminal, a first terminal, and a second terminal. The gate terminal and the lower gate terminal of the third transistor T3 may receive a second gate signal GC. The first terminal of the third transistor T3 may be connected to the second terminal of the first transistor T1. The second terminal of the third transistor T3 may be connected to the gate terminal of the first transistor T1.

During a period in which the third transistor T3 is turned on in response to the second gate signal GC, the third transistor T3 may diode-connect the first transistor T1. Accordingly, the third transistor T3 may compensate for a threshold voltage of the first transistor T1.

The fourth transistor T4 may have a gate terminal, a lower gate terminal, a first terminal, and a second terminal. The gate terminal and the lower gate terminal of the fourth transistor T4 may receive a third gate signal GI. The first terminal of the fourth transistor T4 may be connected to the gate terminal of the first transistor T1. The second terminal of the fourth transistor T4 may receive a gate initialization voltage VINT.

The fourth transistor T4 may be turned on or off in response to the third gate signal GI. For example, when the fourth transistor T4 is an n-channel metal oxide semiconductor (NMOS) transistor, the fourth transistor T4 may be turned on when the third gate signal GI has a positive voltage level and may be turned off when the third gate signal GI has a negative voltage level.

During a period in which the fourth transistor T4 is turned on in response to the third gate signal GI, the gate initialization voltage VINT may be applied to the gate terminal of the first transistor T1. Accordingly, the fourth transistor T4 may initialize the gate terminal of the first transistor T1 to the gate initialization voltage VINT.

The fifth transistor T5 may have a gate terminal, a first terminal, and a second terminal. The gate terminal of the fifth transistor T5 may receive an emission control signal EM. The first terminal of the fifth transistor T5 may receive the driving voltage ELVDD. The second terminal of the fifth transistor T5 may be connected to the first transistor T1. When the fifth transistor T5 is turned on in response to the emission control signal EM, the fifth transistor T5 may provide the driving voltage ELVDD to the first transistor T1.

The sixth transistor T6 may have a gate terminal, a first terminal, and a second terminal. The gate terminal of the sixth transistor T6 may receive the emission control signal EM. The first terminal of the sixth transistor T6 may be connected to the first transistor T1. The second terminal of the sixth transistor T6 may be connected to the organic light emitting diode OLED. When the sixth transistor T6 is turned on in response to the emission control signal EM, the sixth transistor T6 may provide the driving current to the organic light emitting diode OLED.

The seventh transistor T7 may have a gate terminal, a first terminal, and a second terminal. The gate terminal of the seventh transistor T7 may receive a fourth gate signal GB. The first terminal of the seventh transistor T7 may be connected to the organic light emitting diode OLED. The second terminal of the seventh transistor T7 may receive an anode initialization voltage AINT.

When the seventh transistor T7 is turned on in response to the fourth gate signal GB, the seventh transistor T7 may provide the anode initialization voltage AINT to the organic light emitting diode OLED. Accordingly, the seventh transistor T7 may initialize the first terminal of the organic light emitting diode OLED to the anode initialization voltage AINT.

In an embodiment, some of the first to seventh transistors T1, T2, T3, T4, T5, T6, and T7 may be PMOS transistors and the others may be NMOS transistors. In an embodiment, the first, second, fifth, sixth, and seventh transistors T1, T2, T5, T6, and T7 may be PMOS transistors, and the third and fourth transistors T3 and T4 may be NMOS transistors. Thus, the first gate signal GW, the emission control signal EM, and the fourth gate signal GB for turning on the second, fifth, sixth, and seventh transistors T2, T5, T6, and T7, respectively, may have a negative voltage level, and the second gate signal GC and the third gate signal GI for turning on the third and fourth transistors T3 and T4, respectively, may have a positive voltage level.

However, the present disclosure is not limited thereto, and in another embodiment, the first, second, fifth, and sixth transistors T1, T2, T5, and T6 may be PMOS transistors, and the third, fourth, and seventh transistors T3, T4, and T7 may be NMOS transistors. In another embodiment, only one of the first to seventh transistors T1, T2, T3, T4, T5, T6, and T7 may be an NMOS transistor, and the remaining transistors may be PMOS transistors.

A circuit structure of the pixel circuit PC shown in FIG. 4 is only an example and may be variously changed according to various embodiments.

Figure 5:
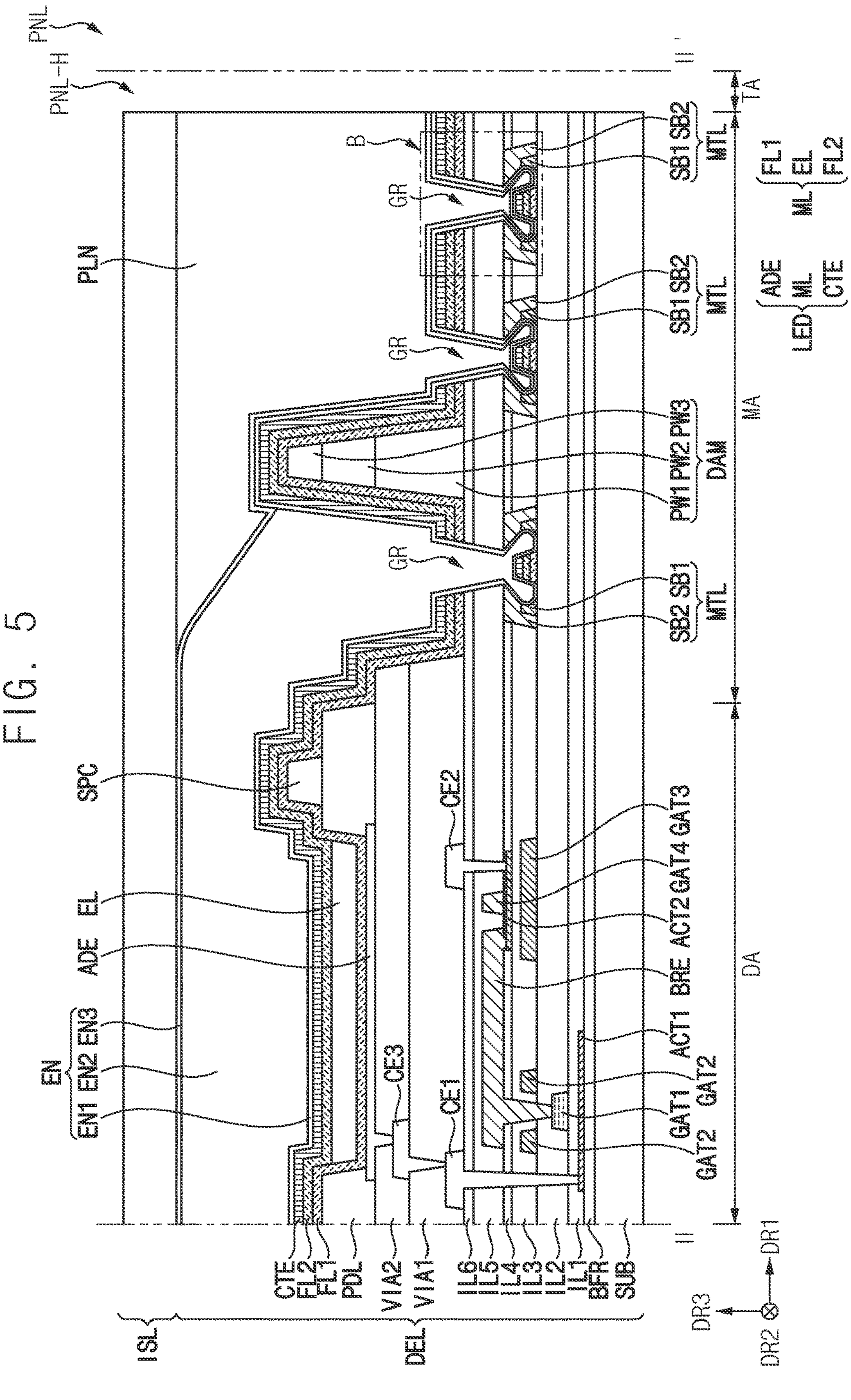
FIG. 5 is a cross-sectional view taken along the line II-II' of FIG. 3.

FIG. 5 is a cross-sectional view taken along the line II-II' of FIG. 3.

Referring to FIGS. 1 to 3 and 5, the display device DD may include the display panel PNL, and the display panel PNL may include the display element layer DEL and the input sensing layer ISL. As described above, the display panel PNL may have the panel opening PNL-H corresponding to the transmission area TA. Although not illustrated in FIG. 5, the optical function layer OFL and/or the window WIN described above with reference to FIG. 2 may be additionally disposed on the input sensing layer ISL.

The display element layer DEL may include a substrate SUB, a buffer layer BFR, first and second active layers, first to fifth conductive layers, and first to sixth insulating layers IL1, IL2, IL3, IL4, IL5, and IL6, first and second via insulating layers VIA1 and VIA2, an anode electrode ADE, an intermediate layer ML, a cathode electrode CTE, an encapsulation layer EN, a planarization layer PLN, the dam DAM, and a metal layer MTL.

The substrate SUB may include glass, quartz, or plastic. In an embodiment, the substrate SUB may have a flexible property and may be designed to be repeatedly folded or unfolded. In an embodiment, the substrate SUB may have a multilayer structure including two or more polymer resin layers and two or more barrier layers including an inorganic material.

The buffer layer BFR may be disposed on the substrate SUB. The buffer layer BFR may prevent penetration of impurities or the like from the outside of the substrate SUB. In an embodiment, the buffer layer BFR may include an inorganic material, such as silicon oxide, silicon nitride, or silicon oxynitride. The buffer layer BFR may have a single-layer or multi-layer structure.

The first active layer may be disposed on the buffer layer BFR. The first active layer may include a first active pattern ACT1. The first active pattern ACT1 may be disposed in the display area DA. The first active pattern ACT1 may have a source area, a drain area, and a channel area located between the source area and the drain area. In an embodiment, the first active pattern ACT1 may include a silicon semiconductor. Examples of silicon semiconductor that can be used as the first active pattern ACT1 may include amorphous silicon and polycrystalline silicon. These may be used alone or in combination with each other.

The first insulating layer IL1 may be disposed on the buffer layer BFR to cover the first active layer (e.g., the first active pattern ACT1). In an embodiment, the first insulating layer IL1 may include an inorganic material, such as silicon oxide, silicon nitride, or silicon oxynitride. The first insulating layer IL1 may have a single-layer or multi-layer structure.

The first conductive layer may be disposed on the first insulating layer IL1. The first conductive layer may include a first gate electrode GAT1. The first gate electrode GAT1 may be disposed in the display area DA. For example, the first gate electrode GAT1 may overlap (e.g., may be vertically aligned with) the first active pattern ACT1. Specifically, the first gate electrode GAT1 may overlap the channel area of the first active pattern ACT1.

Examples of materials that can be used as the first conductive layer may include silver (Ag), an alloy containing silver, molybdenum (Mo), an alloy containing molybdenum, aluminum (Al), an alloy containing aluminum, and aluminum nitride (AlN), tungsten (W), tungsten nitride (WN), copper (Cu), nickel (Ni), chromium (Cr), chromium nitride (CrN), titanium (Ti), tantalum (Ta), platinum (Pt), scandium (Sc), indium tin oxide (ITO), indium zinc oxide (IZO), or the like. These may be used alone or in combination with each other.

The second insulating layer IL2 may be disposed on the first insulating layer IL1 to cover the first conductive layer (e.g., the first gate electrode GAT1). In an embodiment, the second insulating layer IL2 may include an inorganic material, such as silicon oxide, silicon nitride, or silicon oxynitride. The second insulating layer IL2 may have a single-layer or multi-layer structure.

The second conductive layer may be disposed on the second insulating layer IL2. The second conductive layer may include a second gate electrode GAT2 and a third gate electrode GAT3. The second gate electrode GAT2 and the third gate electrode GAT3 may be disposed in the display area DA. For example, the second gate electrode GAT2 may overlap the first active pattern ACT1. The third gate electrode GAT3 may be spaced apart from the second gate electrode GAT2. Specifically, the third gate electrode GAT3 may also be spaced apart from the first active pattern ACT1 and the first gate electrode GAT1.

In an embodiment, a capacitor including the first gate electrode GAT1 and the second gate electrode GAT2 may be formed in the display area DA. For example, the capacitor may correspond to the storage capacitor CST described with reference to FIG. 4. That is, the first gate electrode GAT1 and the second gate electrode GAT2 may correspond to the first terminal and the second terminal of the storage capacitor CST, respectively.

Examples of materials that can be used as the second conductive layer may include silver (Ag), an alloy containing silver, molybdenum (Mo), an alloy containing molybdenum, aluminum (Al), an alloy containing aluminum, and aluminum nitride (AlN), tungsten (W), tungsten nitride (WN), copper (Cu), nickel (Ni), chromium (Cr), chromium nitride (CrN), titanium (Ti), tantalum (Ta), platinum (Pt), scandium (Sc), indium tin oxide (ITO), indium zinc oxide (IZO), or the like. These may be used alone or in combination with each other.

The third insulating layer IL3 may be disposed on the second insulating layer IL2 to cover the second conductive layer (e.g., the second gate electrode GAT2 and the third gate electrode GAT3). In an embodiment, the third insulating layer IL3 may include an inorganic material, such as silicon oxide, silicon nitride, or silicon oxynitride. The third insulating layer IL3 may have a single-layer or multi-layer structure.

The second active layer may be disposed on the third insulating layer IL3. The second active layer may include a second active pattern ACT2. The second active pattern ACT2 may be disposed in the display area DA. For example, the second active pattern ACT2 may overlap the third gate electrode GAT3. The second active pattern ACT2 may have a source area, a drain area, and a channel area located between the source area and the drain area. In an embodiment, the second active pattern ACT2 may include an oxide semiconductor. Examples of an oxide semiconductor that can be used as the second active pattern ACT2 may be InGaZnO (IGZO) or InSnZnO (ITZO). In addition, the oxide semiconductor may further include indium (In), gallium (Ga), tin (Sn), zirconium (Zr), vanadium (V), hafnium (Hf), cadmium (Cd), germanium (Ge), chromium (Cr), titanium (Ti), and zinc (Zn). These may be used alone or in combination with each other.

The fourth insulating layer IL4 may be disposed on the third insulating layer IL3 to cover the second active layer (e.g., the second active pattern ACT2). In an embodiment, the fourth insulating layer IL4 may include an inorganic material, such as silicon oxide, silicon nitride, or silicon oxynitride. The fourth insulating layer IL4 may have a single-layer or multi-layer structure.

The third conductive layer may be disposed on the fourth insulating layer IL4. The third conductive layer may include a fourth gate electrode GAT4 and a bridge electrode BRE. The fourth gate electrode GAT4 and the bridge electrode BRE may be disposed in the display area DA. For example, the fourth gate electrode GAT4 may overlap the second active pattern ACT2. Specifically, the fourth gate electrode GAT4 may overlap the channel area of the second active pattern ACT2. The bridge electrode BRE may contact the first gate electrode GAT1 through a contact hole (e.g., a contact opening) penetrating the second insulating layer IL2, the third insulating layer IL3, and the fourth insulating layer IL4 and may contact the second active pattern ACT2 through a contact hole (e.g., a contact opening) penetrating the third insulating layer IL3. Specifically, the bridge electrode BRE may contact at least one of the source area of the second active pattern ACT2 and the drain area of the second active pattern ACT2. The second active pattern ACT2 and the first gate electrode GAT1 may be connected to each other by a bridge connection through the bridge electrode BRE.

Examples of materials that can be used as the third conductive layer may include silver (Ag), an alloy containing silver, molybdenum (Mo), an alloy containing molybdenum, aluminum (Al), an alloy containing aluminum, and aluminum nitride (AlN), tungsten (W), tungsten nitride (WN), copper (Cu), nickel (Ni), chromium (Cr), chromium nitride (CrN), titanium (Ti), tantalum (Ta), platinum (Pt), scandium (Sc), indium tin oxide (ITO), indium zinc oxide (IZO), or the like. These may be used alone or in combination with each other.

The fifth insulating layer IL5 may be disposed on the fourth insulating layer IL4 to cover the third conductive layer (e.g., the fourth gate electrode GAT4 and the bridge electrode BRE). In an embodiment, the fifth insulating layer IL5 may include an inorganic material, such as silicon oxide, silicon nitride, or silicon oxynitride. The fifth insulating layer IL5 may have a single-layer or multi-layer structure.

The sixth insulating layer IL6 may be disposed on the fifth insulating layer IL5. In an embodiment, the sixth insulating layer IL6 may include an inorganic material, such as silicon oxide, silicon nitride, or silicon oxynitride. The sixth insulating layer IL6 may have a single-layer or multi-layer structure. In another embodiment, the sixth insulating layer IL6 may be omitted.

The fourth conductive layer may be disposed on the sixth insulating layer IL6. The fourth conductive layer may include a first connection electrode CE1 and a second connection electrode CE2. The first connection electrode CE1 and the second connection electrode CE2 may be disposed in the display area DA. For example, the first connection electrode CE1 may contact the first active pattern ACT1 through a contact hole (e.g., a contact opening) penetrating the first to sixth insulating layers IL1, IL2, IL3, IL4, IL5, and IL6. The second connection electrode CE2 may contact the second active pattern ACT2 through a contact hole (e.g., a contact opening) penetrating the fourth to sixth insulating layers IL4, IL5, and IL6. Specifically, the first connection electrode CE1 may contact at least one of the source area of the first active pattern ACT1 and the drain area of the first active pattern ACT1, and the second connection electrode CE2 may contact at least one of the source area of the second active pattern ACT2 and the drain area of the second active pattern ACT2.

In an embodiment, in the display area DA, a first thin film transistor including the first active pattern ACT1, the first gate electrode GAT1, and the first connection electrode CE1 may be formed, and a second thin film transistor including the active pattern ACT2, the third gate electrode GAT3, the fourth gate electrode GAT4, and the second connection electrode CE2 may be formed.

For example, the first thin film transistor may correspond to any one of the first transistor T1, the second transistor T2, the fifth transistor T5, the sixth transistor T6, and the seventh transistor T7 described with reference to FIG. 4. Specifically, the first thin film transistor may correspond to the first transistor T1. Also, the second thin film transistor may correspond to any one of the third transistor T3 and the fourth transistor T4 described with reference to FIG. 4.

Examples of materials that can be used as the fourth conductive layer may include silver (Ag), an alloy containing silver, molybdenum (Mo), an alloy containing molybdenum, aluminum (Al), an alloy containing aluminum, and aluminum nitride (AlN), tungsten (W), tungsten nitride (WN), copper (Cu), nickel (Ni), chromium (Cr), chromium nitride (CrN), titanium (Ti), tantalum (Ta), platinum (Pt), scandium (Sc), indium tin oxide (ITO), indium zinc oxide (IZO), or the like. These may be used alone or in combination with each other.

The first via insulating layer VIA1 may be disposed on the sixth insulating layer IL6 to cover the fourth conductive layer (e.g., the first connection electrode CE1 and the second connection electrode CE2). In an embodiment, the first via insulating layer VIA1 may include an organic material, such as polyacrylic resin, polyimide resin, or acrylic resin. The first via insulating layer VIA1 may have a single-layer or multi-layer structure.

The fifth conductive layer may be disposed on the first via insulating layer VIA1. The fifth conductive layer may include a third connection electrode CE3. The third connection electrode CE3 may be disposed in the display area DA. For example, the third connection electrode CE3 may contact the first connection electrode CE1 through a contact hole (e.g., a contact opening) penetrating the first via insulation layer VIA1.

Examples of materials that can be used as the fifth conductive layer may include silver (Ag), an alloy containing silver, molybdenum (Mo), an alloy containing molybdenum, aluminum (Al), an alloy containing aluminum, and aluminum nitride (AlN), tungsten (W), tungsten nitride (WN), copper (Cu), nickel (Ni), chromium (Cr), chromium nitride (CrN), titanium (Ti), tantalum (Ta), platinum (Pt), scandium (Sc), indium tin oxide (ITO), indium zinc oxide (IZO), or the like. These may be used alone or in combination with each other.

The second via insulating layer VIA2 may be disposed on the first via insulating layer VIA1 to cover the fifth conductive layer (e.g., the third connection electrode CE3). In an embodiment, the second via insulating layer VIA2 may include an organic material, such as polyacrylic resin, polyimide resin, or acrylic resin. The first via insulating layer VIA1 may have a single-layer or multi-layer structure.

The anode electrode ADE may be disposed on the second via insulating layer VIA2. The anode electrode ADE may be disposed in the display area DA. For example, the anode electrode ADE may contact the third connection electrode CE3 through a contact hole (e.g., a contact opening) penetrating the second via insulating layer VIA2.

The pixel defining layer PDL may be disposed on the second via insulating layer VIA2. A pixel opening exposing a portion of the anode electrode ADE may be defined in the pixel defining layer PDL. In an embodiment, the pixel defining layer PDL may include an organic material, such as polyacrylic resin, polyimide resin, or acrylic resin.

A spacer SPC may be disposed on the pixel defining layer PDL. The spacer SPC may prevent damage to the substrate SUB and components stacked on the substrate SUB in a process of manufacturing the display device DD. In an embodiment, the spacer SPC may include an organic material, such as polyacrylic resin, polyimide resin, or acrylic resin.

The intermediate layer ML may be disposed on the pixel defining layer PDL. For example, the intermediate layer ML may cover the pixel defining layer PDL and the spacer SPC. The intermediate layer ML may include the emission layer EL disposed in the pixel opening in the pixel defining layer PDL. The emission layer EL may include an organic material for emitting light of a predetermined color.

The intermediate layer ML may further include a first functional layer FL1 disposed below the emission layer EL and a second functional layer FL2 disposed above the emission layer EL. The first functional layer FL1 may include a hole transport layer (HTL) and/or a hole injection layer (HIL). The second functional layer FL2 may include an electron transport layer (ETL) and/or an electron injection layer (EIL).

The cathode electrode CTE may be disposed on the intermediate layer ML. The emission layer EL may emit light based on a voltage difference between the anode electrode ADE and the cathode electrode CTE.

In an embodiment, a light emitting device LED including the anode electrode ADE, the intermediate layer ML, and the cathode electrode CTE may be formed in the display area DA. For example, the light emitting device LED may correspond to the organic light emitting diode OLED described with reference to FIG. 4.

In an embodiment, the first functional layer FL1, the second functional layer FL2, and/or the cathode electrode CTE may extend from the display area DA to the intermediate area MA. That is, the first functional layer FL1, the second functional layer FL2, and/or the cathode electrode CTE may be disposed over an entire surface of the display area DA and the intermediate area MA. In an embodiment, at least a portion of the first functional layer FL1, the second functional layer FL2, and/or the cathode electrode CTE may be disconnected (or separated) by the groove GR disposed in the intermediate area MA. This will be described later in more detail with reference to FIG. 6.

The encapsulation layer EN may be disposed on the cathode electrode CTE. The encapsulation layer EN may protect the light emitting device LED from impurities, such as oxygen and moisture. In an embodiment, the encapsulation layer EN may include at least one inorganic encapsulation layer and at least one organic encapsulation layer. For example, the encapsulation layer EN may include a first inorganic encapsulation layer EN1, an organic encapsulation layer EN2, and a second inorganic encapsulation layer EN3, sequentially stacked on each other.

The dam DAM may be disposed in the intermediate area MA. The dam DAM may prevent the organic encapsulation layer EN2 from overflowing in a direction toward the transmission area TA. To this end, the dam DAM may protrude from the sixth insulating layer IL6 to have a certain height. Accordingly, the organic encapsulation layer EN2 may not substantially exist in an area surrounded by the dam DAM. In the area surrounded by the dam DAM, the first inorganic encapsulation layer EN1 and the second inorganic encapsulation layer EN3 may contact each other.

In an embodiment, the dam DAM may have a multi-layered structure. For example, the dam DAM may include a first partition wall PW1, a second partition wall PW2, and a third partition wall PW3, sequentially stacked on each other. In an embodiment, the first partition wall PW1 may include a same material as the first via insulating layer VIA1 and may be formed through a same process. The second partition wall PW2 may include a same material as the second via insulating layer VIA2 and may be formed through a same process. The third partition wall PW3 may include a same material as the pixel defining layer PDL and/or the spacer SPC and may be formed through a same process. However, materials of each of the first partition wall PW1, the second partition wall PW2, and the third partition wall PW3 are not limited thereto.

Also, in another embodiment, the dam DAM may have a single-layer structure, may have a structure in which two layers are stacked, or may have a structure in which four or more layers are stacked. That is, the dam DAM may have various structures capable of preventing the organic encapsulation layer EN2 from overflowing.

Each of the first via insulation layer VIA1, the second via insulation layer VIA2, and the pixel defining layer PDL extending from the display area DA to the intermediate area MA may disposed outside the area surrounded by the dam DAM. In such an embodiment, each of the first via insulating layer VIA1, the second via insulating layer VIA2, and the pixel defining layer PDL may be spaced apart from the dam DAM.

One or more grooves GR may be disposed in the intermediate area MA. The groove GR may include a metal opening (MO, see, e.g., FIG. 6) of the metal layer MTL disposed in the intermediate area MA and an insulating opening (IO, see, e.g., FIG. 6) in an upper insulating layer (e.g., the fifth insulating layer IL5 and the sixth insulating layer IL6) disposed on the metal layer MTL. A detailed structure of the groove GR will be described later with reference to FIG. 6.

Although one groove GR is positioned between the display area DA and the dam DAM in the embodiment illustrated in FIG. 5 and two grooves GR are defined in the area surrounded by the dam DAM, the present disclosure is not limited thereto. In another embodiment, the groove GR may be defined only between the display area DA and the dam DAM, or the groove GR may be defined only in the area surrounded by the dam DAM. Also, two or more grooves GR may be defined between the display area DA and the dam DAM, or one or three or more grooves GR may be defined in the area surrounded by the dam DAM.

In an embodiment, the first functional layer FL1, the second functional layer FL2, and/or the cathode electrode CTE may be disconnected by the groove GR. The first inorganic encapsulation layer EN1 and the second inorganic encapsulation layer EN3 may continuously extend in (or through) the intermediate area MA. For example, the first inorganic encapsulation layer EN1 and the second inorganic encapsulation layer EN3 may continuously cover an inner surface and the bottom surface of the groove GR along a shape of the groove GR.

The planarization layer PLN may be disposed in the intermediate area MA. The planarization layer PLN may cover an area of the intermediate area MA that is not covered by the organic encapsulation layer EN2. Accordingly, the planarization layer PLN may compensate for a step difference on an upper surface of the display element layer DEL. In an embodiment, the planarization layer PLN may include an organic material.

Figure 6:
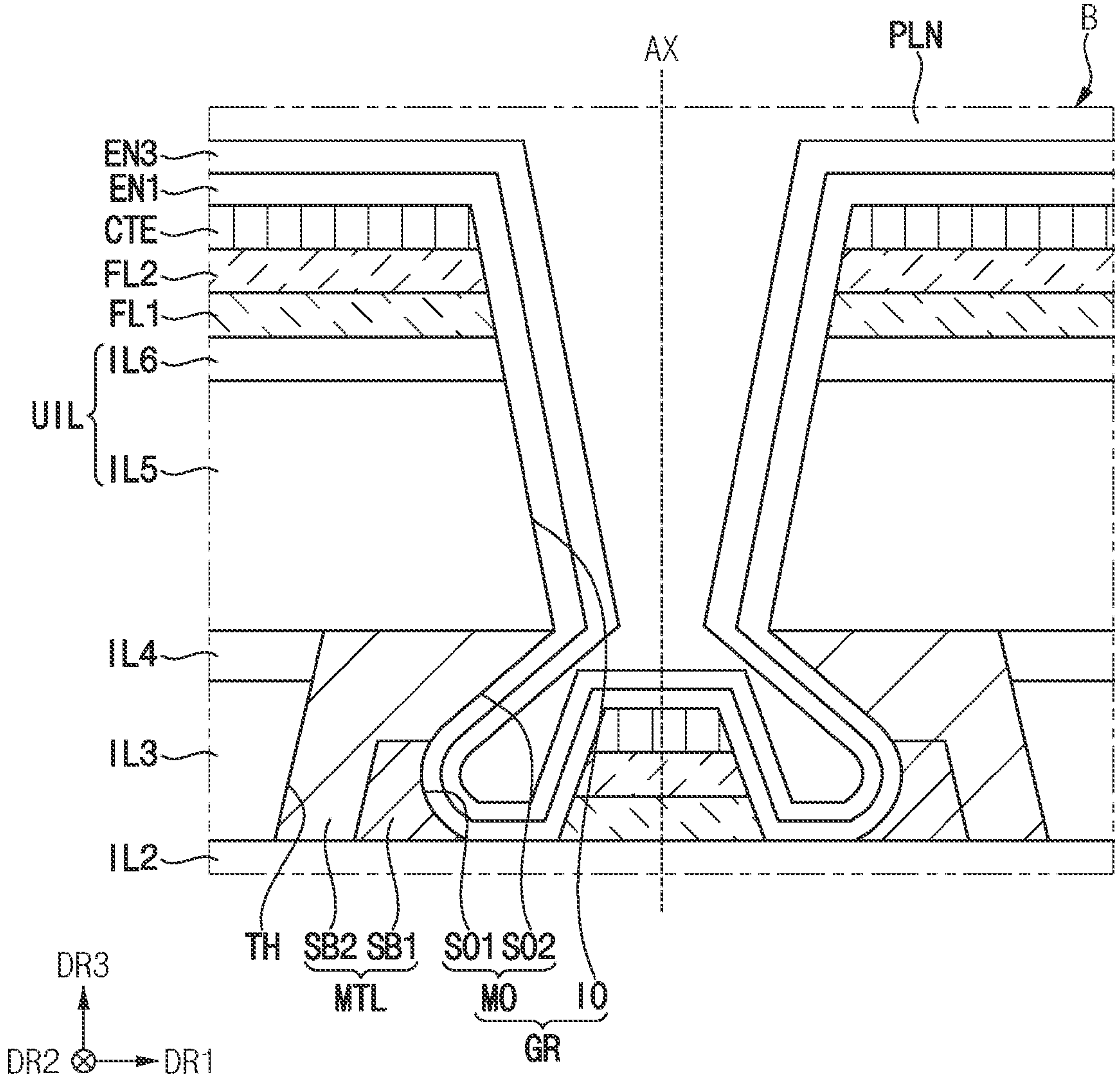
FIG. 6 is an enlarged view of the area B of FIG. 5.

FIG. 6 is an enlarged view of the area B of FIG. 5.

Referring to FIGS. 5 and 6, the groove GR may have the metal opening MO in the metal layer MTL and the insulating opening IO in the upper insulating layer UIL disposed on the metal layer MTL. The upper insulating layer UIL may include the fifth insulating layer IL5 and the sixth insulating layer IL6. That is, the groove GR may be defined by interconnecting the metal opening MO and the insulating opening IO.

In an embodiment, the groove GR may be axisymmetric with respect to a central axis AX of the groove GR. The central axis AX may be an imaginary line passing through a center of the groove GR and extending in the third direction DR3.

The metal layer MTL may have a two-layer structure in which a first sub-layer SB1 and a second sub-layer SB2 are sequentially stacked. The second sub-layer SB2 may be disposed to cover an outer surface of the first sub-layer SB1. Also, each of the first sub-layer SB1 and the second sub-layer SB2 may have an opening defining the metal opening MO. Specifically, the first sub-layer SB1 may have a first sub-opening SO1, and the second sub-layer SB2 may have a second sub-opening SO2 connected to the first sub-opening SO1. That is, the metal opening MO may be defined by interconnecting the first sub-opening SO1 and the second sub-opening SO2.

In an embodiment, the first sub-layer SB1 and the second conductive layer (e.g., the second gate electrode GAT2 and the third gate electrode GAT3) may be formed together in a same process. For example, the first sub-layer SB1 may include a same material as the second conductive layer. For example, the first sub-layer SB1 may be disposed on a same layer as the second conductive layer. Specifically, the first sub-layer SB1 may be disposed on the second insulating layer IL2.

Examples of materials that can be used as the first sub-layer SB1 may include silver (Ag), an alloy containing silver, molybdenum (Mo), an alloy containing molybdenum, aluminum (Al), an alloy containing aluminum, and aluminum nitride (AlN), Tungsten (W), Tungsten Nitride (WN), Copper (Cu), Nickel (Ni), Chromium (Cr), Chromium Nitride (CrN), Titanium (Ti), Tantalum (Ta), Platinum (Pt), scandium (Sc), indium tin oxide (ITO), indium zinc oxide (IZO), or the like. These may be used alone or in combination with each other.

In an embodiment, the second sub-layer SB2 and the third conductive layer (e.g., the fourth gate electrode GAT4 and the bridge electrode BRE) may be formed together in a same process. In other words, the second sub-layer SB2 may include a same material as the third conductive layer.

Examples of materials that can be used as the second sub-layer SB2 may include silver (Ag), an alloy containing silver, molybdenum (Mo), an alloy containing molybdenum, aluminum (Al), an alloy containing aluminum, and aluminum nitride (AlN), Tungsten (W), Tungsten Nitride (WN), Copper (Cu), Nickel (Ni), Chromium (Cr), Chromium Nitride (CrN), Titanium (Ti), Tantalum (Ta), Platinum (Pt), scandium (Sc), indium tin oxide (ITO), indium zinc oxide (IZO), or the like. These may be used alone or in combination with each other.

As shown in FIG. 6, the metal layer MTL may be disposed inside a through hole (e.g., an opening) TH penetrating the third insulating layer IL3 and the fourth insulating layer IL4. Although an edge of an upper surface of the metal layer MTL coincides with an edge of an upper surface of the fourth insulating layer IL4, and an edge of a lower surface of the metal layer MTL coincides with an edge of a lower surface of the third insulating layer IL3 in FIGS. 5 and 6, the present disclosure is not limited thereto. In another embodiment, the metal layer MTL may have various structures disposed inside the through hole TH penetrating the third insulating layer IL3 and the fourth insulating layer IL4.

In an embodiment, an inner surface of the metal opening MO may be more recessed in a direction away from the center of the groove GR than an inner surface of the insulating opening IO is. Accordingly, the groove GR may have an undercut structure. Accordingly, the first functional layer FL1, the second functional layer FL2, and/or the cathode electrode CTE extending toward the intermediate area MA may be disconnected at the undercut structure. That is, the first functional layer FL1, the second functional layer FL2, and/or the cathode electrode CTE may be discontinuously formed by the groove GR.

The first inorganic encapsulation layer EN1 and the second inorganic encapsulation layer EN3, which have relatively excellent step coverage, may continuously extend along a shape of the groove GR.

Because the first functional layer FL1, the second functional layer FL2, and/or the cathode electrode CTE are disconnected at the groove GR, moisture and foreign substances penetrating into the display area DA may be blocked from the transmission area TA.

FIGS. 7 to 13 are cross-sectional views illustrating a manufacturing method of the display panel shown in FIG. 5.

Hereinafter, a method of forming the groove GR will be described with reference to FIGS. 5 and 7 to 13. For convenience of explanation, FIGS. 7 to 13 are enlarged views illustrating an area of the display panel at where the groove GR is defined, and at least some of components not shown in FIGS. 7 to 13 may be formed together with some of components shown in FIGS. 7 to 13.

Figure 7:
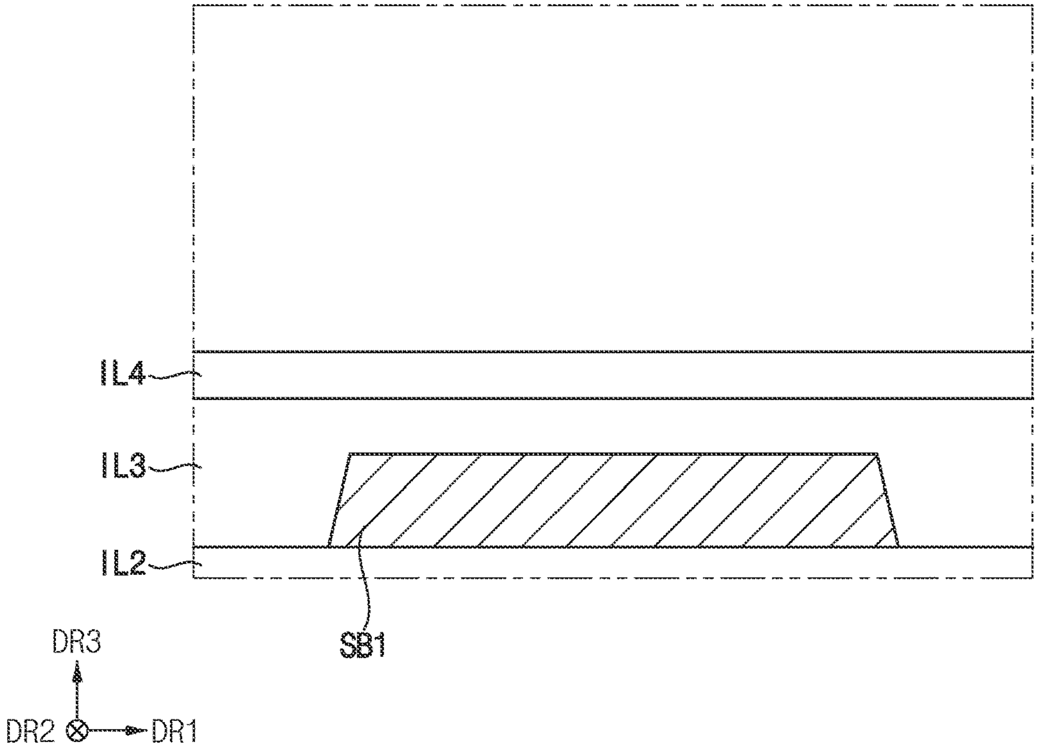
FIGS. 7 to 13 are cross-sectional views illustrating a manufacturing method of the display panel shown in FIGS. 1-5.

Referring to FIGS. 5 and 7, after forming the buffer layer BFR, the first active layer, the first insulating layer IL1, the first conductive layer, and the second insulating layer IL2 on the substrate SUB, the first sub-layer SB1 and the second conductive layer may be formed on the second insulating layer IL2. That is, the first sub-layer SB1 and the second conductive layer may be formed together in a same process. In other words, the first sub-layer SB1, the second gate electrode GAT2, and the third gate electrode GAT3 may be formed together through a same process. For example, after a preliminary conductive layer is applied on the second insulating layer IL2, areas of the preliminary conductive layer other than areas corresponding to the first sub-layer SB1 and the second conductive layer may be selectively removed so that the first sub-layer SB1 and the second conductive layer are formed in a same process.

Thereafter, the third insulating layer IL3 may be formed to cover the first sub-layer SB1 and the second conductive layer, the second active layer may be formed on the third insulating layer IL3, and the fourth insulating layer IL4 may be formed to cover the second active layer.

Figure 8:
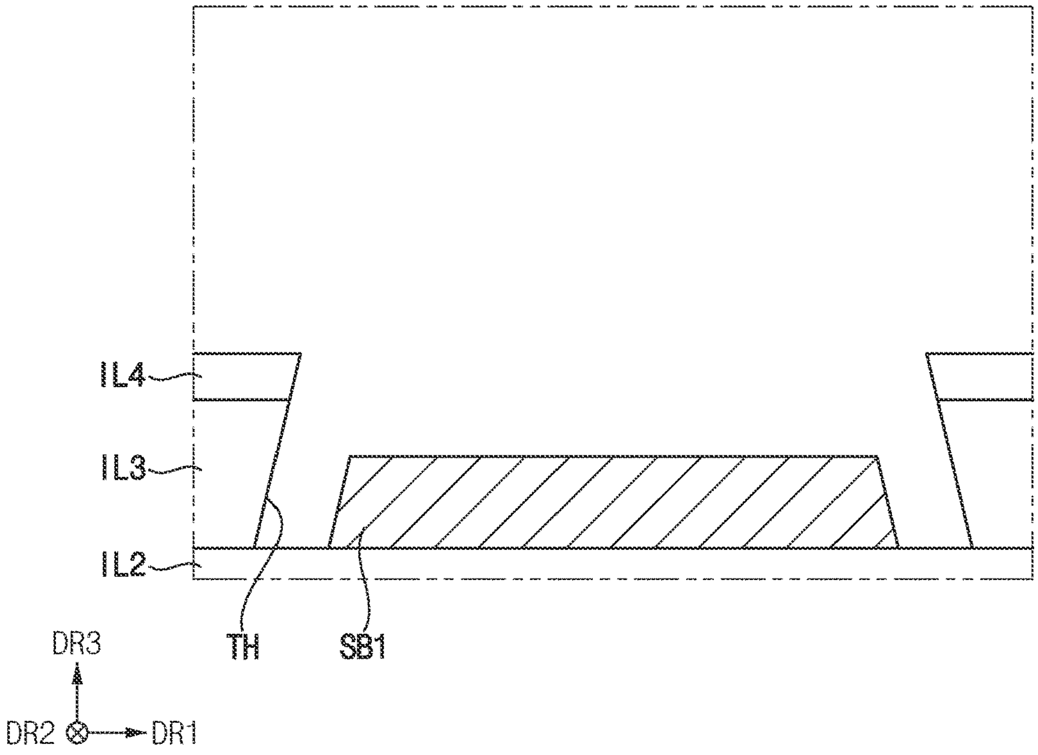

Further referring to FIG. 8, the through hole TH may be formed through the third insulating layer IL3 and the fourth insulating layer IL4. The through hole TH may expose the first sub-layer SB1. In an embodiment, the through hole TH may be formed together with contact holes for contacting the bridge electrode BRE with the first gate electrode GAT1 and the second active pattern ACT2 in a same process.

Figure 9:
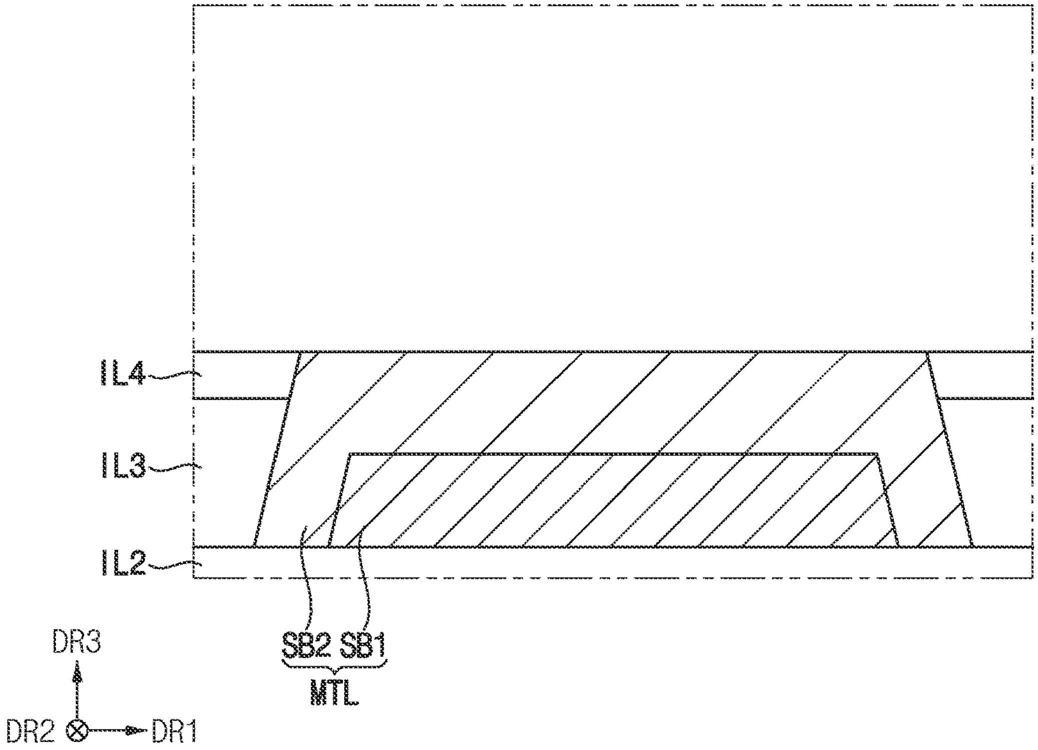

Referring further to FIG. 9, the second sub-layer SB2 may be formed to cover the outer surface of the first sub-layer SB1. For example, the second sub-layer SB2 may be formed in (e.g., may fill) the through hole TH in the intermediate area MA. Accordingly, the metal layer MTL, in which the first sub-layer SB1 and the second sub-layer SB2 are sequentially stacked, may be formed in the intermediate area MA. That is, the metal layer MTL may be formed inside the through hole TH penetrating the third insulating layer IL3 and the fourth insulating layer IL4.

Although an edge of an upper surface of the metal layer MTL coincides with (e.g., is planar with) an edge of an upper surface of the fourth insulating layer IL4, and an edge of a lower surface of the metal layer MTL coincides with an edge of a lower surface of the third insulating layer IL3 in FIGS. 6 and 9, the present disclosure is not limited thereto. In another embodiment, the metal layer MTL may have various structures disposed inside the through hole TH.

In an embodiment, the second sub-layer SB2 may be formed together with the third conductive layer in a same process. In other words, the second sub-layer SB2, the fourth gate electrode GAT4, and the bridge electrode BRE may be formed together in a same process. For example, after a preliminary conductive layer is applied on the second insulating layer IL2, the fourth insulating layer IL4, and the first sub-layer SB1, areas of the preliminary conductive layer other than areas corresponding to the second sub-layer SB2 and the third conductive layer may be selectively removed so that the second sub-layer SB1 and the third conductive layer are formed in a same process.

The bridge electrode BRE may be formed to contact the second gate electrode GAT2 and the second active pattern ACT2 through the contact holes, and the fourth gate electrode GAT4 may be formed to overlap the second active pattern ACT2 and the third gate electrode GAT3.

Figure 10:
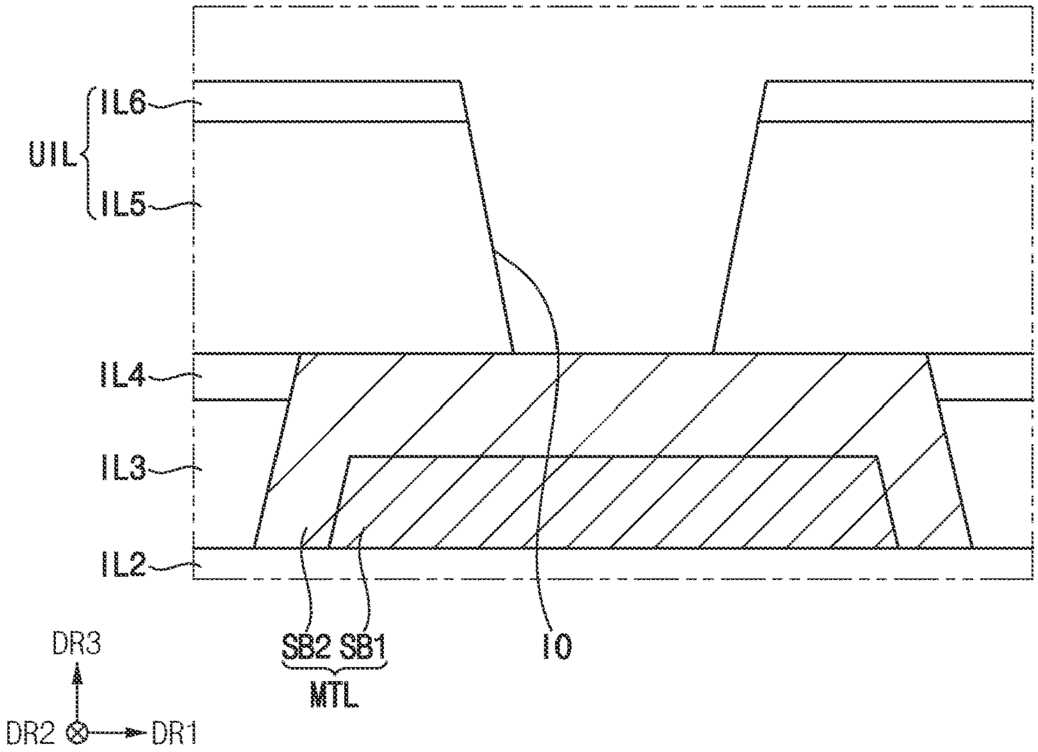

Referring further to FIG. 10, the upper insulating layer UIL may be formed on the fourth insulating layer IL4 to cover the third conductive layer and the second sub-layer SB2. In an embodiment, the upper insulating layer UIL may be formed by sequentially stacking the fifth insulating layer IL5 and the sixth insulating layer IL6.

The upper insulating layer UIL may have the insulating opening IO exposing a portion of the second sub-layer SB2. That is, after forming the upper insulating layer UIL, the insulating opening IO exposing a portion of the second sub-layer SB2 may be formed. In an embodiment, the insulating opening IO may be formed together with a contact hole for contacting the first connection electrode CE1 with the first active pattern ACT1 and a contact hole for contacting the second connection electrode CE2 with the second active pattern ACT2 in a same process.

Figure 11:
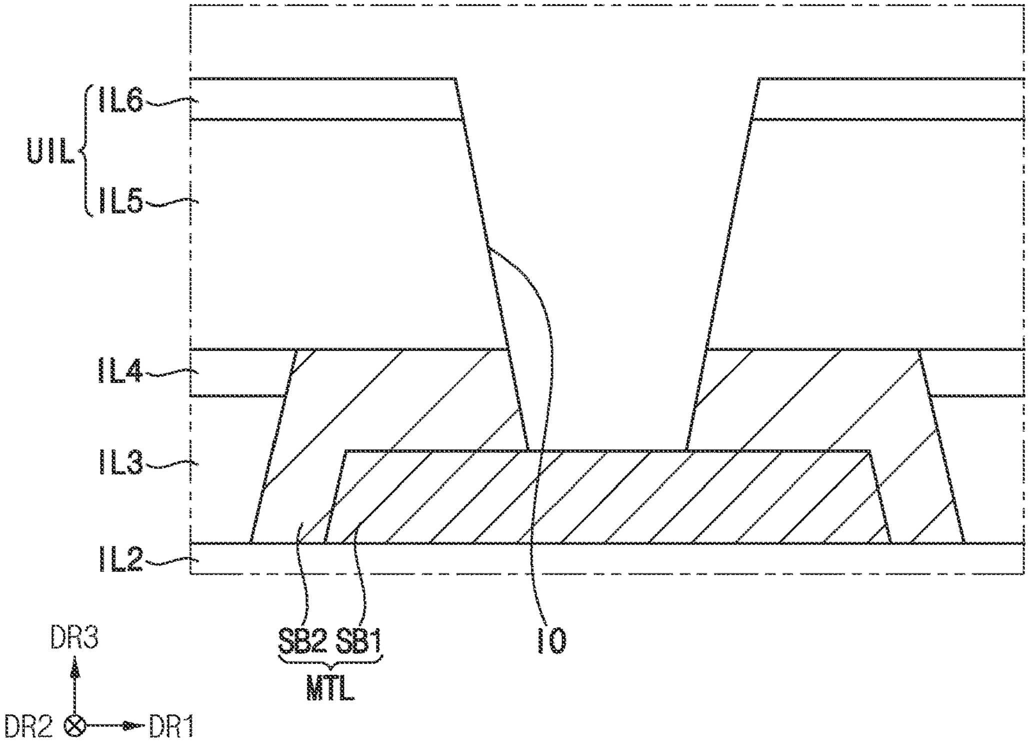

Referring further to FIG. 11, the second sub-layer SB2 exposed from (or through) the upper insulating layer UIL may be removed. That is, a portion of the second sub-layer SB2 exposed through the insulating opening IO may be removed. Accordingly, a portion of the first sub-layer SB1 may be exposed from (or through) the second sub-layer SB2.

In an embodiment, removal of the second sub-layer SB2 may be performed together with the forming of the fourth conductive layer. That is, a removal of the second sub-layer SB2 may be performed together in a process of forming the first connection electrode CE1 and the second connection electrode CE2.

The fourth conductive layer may be formed by applying a preliminary conductive layer on the upper insulating layer UIL and selectively removing areas of the preliminary conductive layer other than areas corresponding to the fourth conductive layer. Accordingly, in a process of selectively removing areas of the preliminary conductive layer other than areas corresponding to the fourth conductive layer, the second sub-layer SB2 may also be removed.

In an embodiment, the process of selectively removing areas of the preliminary conductive layer other than areas corresponding to the fourth conductive layer may be performed by a dry etching process. That is, a portion of the second sub-layer SB2 may be removed through a dry etching process.

Also, removal of the second sub-layer SB2 may be performed together with the forming of the fifth conductive layer. That is, removal of the second sub-layer SB2 may be performed together with the forming of the third connection electrode CE3.

The fifth conductive layer may be formed by applying a preliminary conductive layer on the upper insulating layer UIL, the first via insulating layer VIA1, and the second sub-layer SB2 and selectively removing areas of the preliminary conductive layer other than areas corresponding to the fifth conductive layer. Accordingly, in a process of selectively removing areas of the preliminary conductive layer other than areas corresponding to the fifth conductive layer, the second sub-layer SB2 may also be removed.

In an embodiment, the process of selectively removing areas of the preliminary conductive layer other than areas corresponding to the fifth conductive layer may be performed by a dry etching process. That is, a portion of the second sub-layer SB2 may be removed through a dry etching process.

Removal of the second sub-layer SB2 may be performed concurrently (or simultaneously) in both the forming of the fourth conductive layer and the forming of the fifth conductive layer. However, the present disclosure is not limited thereto, and removal of the second sub-layer SB2 may be selectively performed together with any one of the process of forming the fourth conductive layer and the process of forming the fifth conductive layer.

A portion of the first sub-layer SB1 may also be removed when the second sub-layer SB2 is removed.

Figure 12:
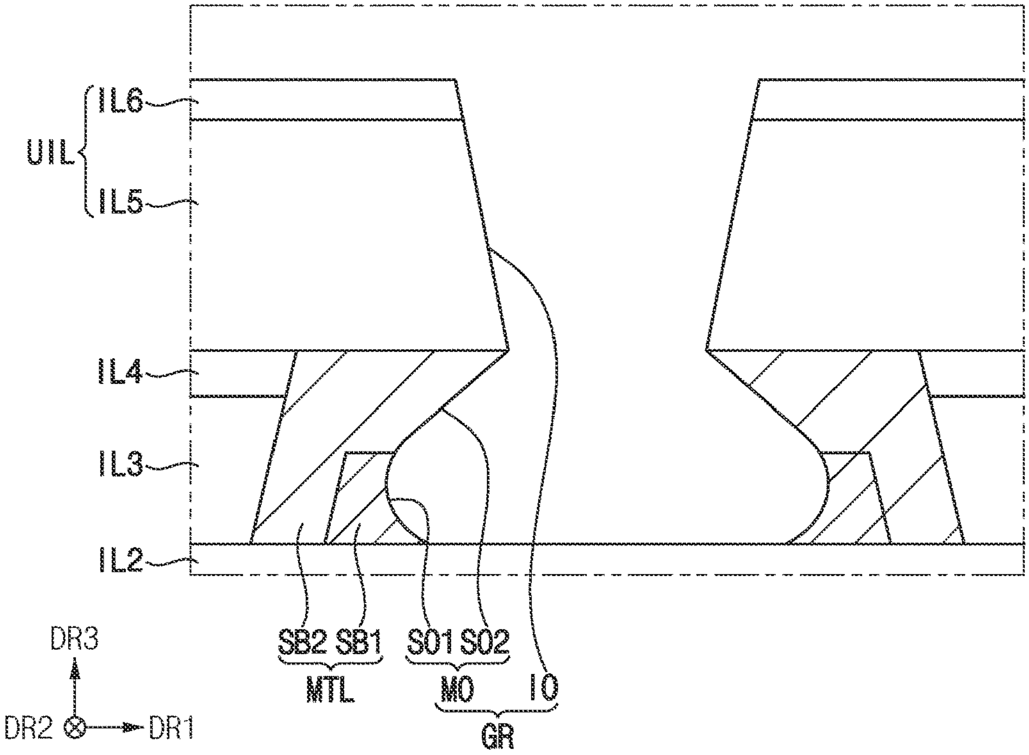

Further referring to FIG. 12, the first sub-layer SB1 exposed from (or exposed through) the second sub-layer SB2 may be removed.

In one embodiment, removal of the first sub-layer SB1 may be performed together with the forming of the anode electrode ADE. The anode electrode ADE may be formed by applying a preliminary conductive layer on the upper insulating layer UIL, the second via insulating layer VIA2, and the first sub-layer SB1 and selectively remaining (or leaving) areas of the preliminary conductive layer corresponding to the anode electrode ADE. Accordingly, in a process of selectively remaining areas of the preliminary conductive layer corresponding to anode electrode ADE, the first sub-layer SB1 may be removed.

In an embodiment, the process of selectively remaining areas of the preliminary conductive layer corresponding to the anode electrode ADE may be performed by a wet etching process. That is, a portion of the first sub-layer SB1 may be removed through a wet etching process.

In the process of removing the second sub-layer SB2, a portion of the first sub-layer SB1 may be removed together. Accordingly, the first sub-opening SO1 penetrating the first sub-layer SB1 and the second sub-opening SO2 penetrating the second sub-layer SB2 may be formed. In addition, the first sub-opening SO1 and the second sub-opening SO2 may be interconnected to define the metal opening MO, and the metal opening MO may be interconnected with the insulating opening IO to define the groove GR. Accordingly, the groove GR may be formed in the intermediate region MA.

In addition, the inner surface of the metal opening MO may be more recessed (or farther recessed) in a direction away from the center of the groove GR than the inner surface of the insulating opening IO. Accordingly, the groove GR may have an undercut structure.

For example, because a portion of the first sub-layer SB1 is removed through an anisotropic wet etching process and a portion of the second sub-layer SB2 is removed together in a corresponding process, the inner surface of the metal opening MO may be more recessed in the direction away from the center of the groove GR than the inner surface of the insulating opening IO.

Figure 13:
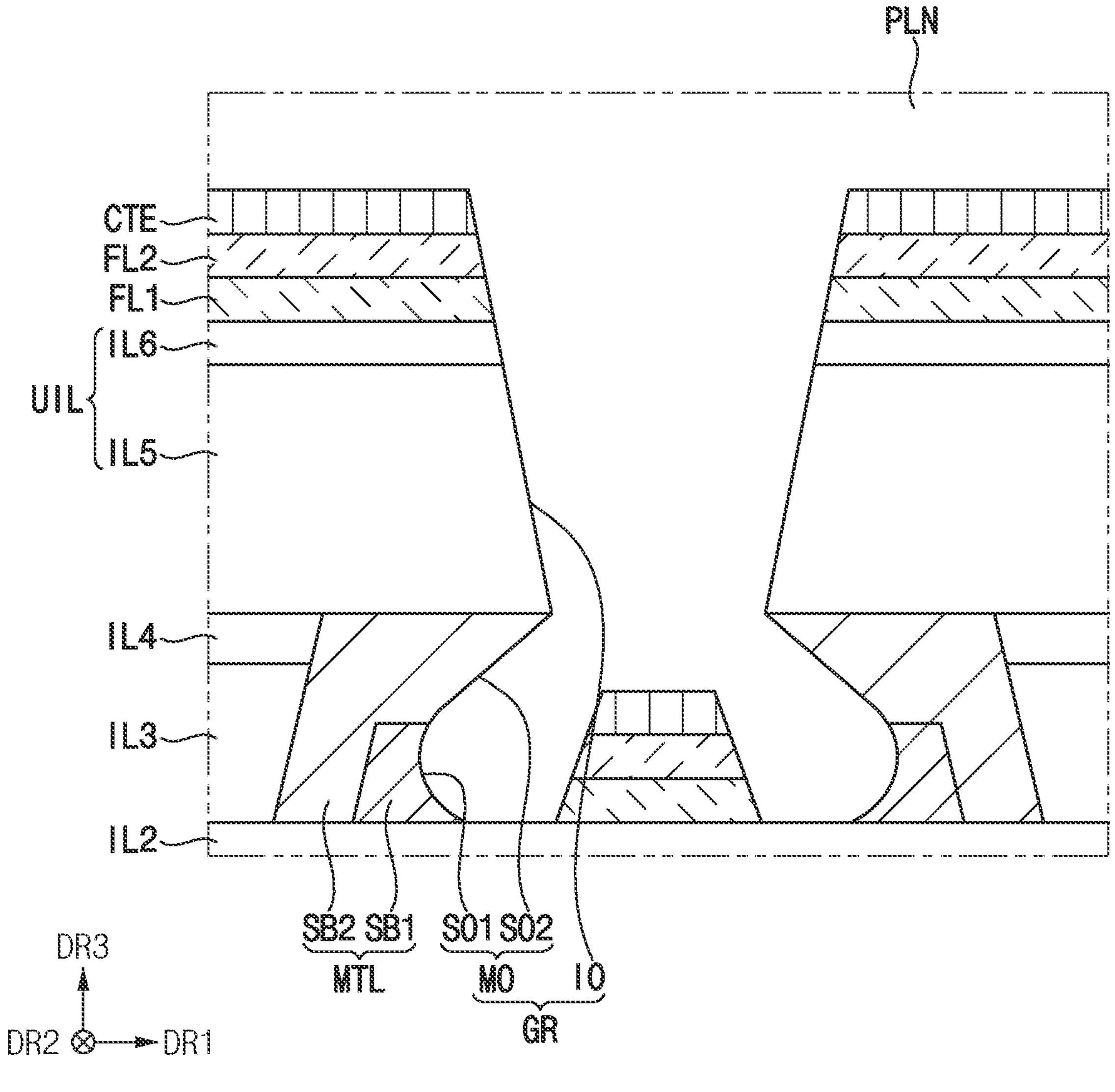

Further referring to FIG. 13, the intermediate layer ML and the cathode electrode CTE may be sequentially formed. The intermediate layer ML may include the first functional layer FL1, the emission layer EL, and the second functional layer FL2. When the first functional layer FL1, the second functional layer FL2, and/or the cathode electrode CTE are formed, they may extend from the display area DA to the intermediate area MA. However, at least a portion of the first functional layer FL1, the second functional layer FL2, and/or the cathode electrode CTE may be disconnected (or separated) by the groove GR disposed in the intermediate area MA.

Then, as shown in FIGS. 5 and 6, the encapsulation layer EN may be formed on the cathode electrode CTE. The encapsulation layer EN may include the first inorganic encapsulation layer EN1, the organic encapsulation layer EN2, and the second inorganic encapsulation layer EN3. The organic encapsulation layer EN2 may be blocked by the dam DAM and may not be formed in the area surrounded by the dam DAM. The first inorganic encapsulation layer EN1 and the second inorganic encapsulation layer EN3 may extend from the display area DA to the intermediate area MA and may be continuously formed along a shape of the groove GR.

The method of manufacturing the display panel according to embodiments of the present disclosure may further include forming the planarization layer PLN in the intermediate area MA and forming the input sensing layer ISL and/or the optical function layer OFL on the encapsulation layer EN and the planarization layer PLN.

According to the manufacturing method of the display device DD, according to embodiments of the present disclosure, in a process of forming the second conductive layer (e.g., the second gate electrode GAT2 and the third gate electrode GAT3), the third conductive layer (e.g., the fourth gate electrode GAT4 and the bridge electrode BRE), the metal layer MTL in which the first sub-layer SB1 and the second sub-layer SB2 are stacked may be formed together in the intermediate area MA. In addition, in a process of forming the fourth conductive layer (e.g., the first connection electrode CE1 and the second connection electrode CE2), the fifth entire layer (e.g., the third connection electrode CE3), and the anode electrode ADE, a portion of the metal layer MTL may be removed together to define the groove GR having an undercut structure. Accordingly, a separate process for forming a groove having an undercut structure may not be required. Accordingly, efficiency of the manufacturing process of the display device DD may be improved.

Figure 14:
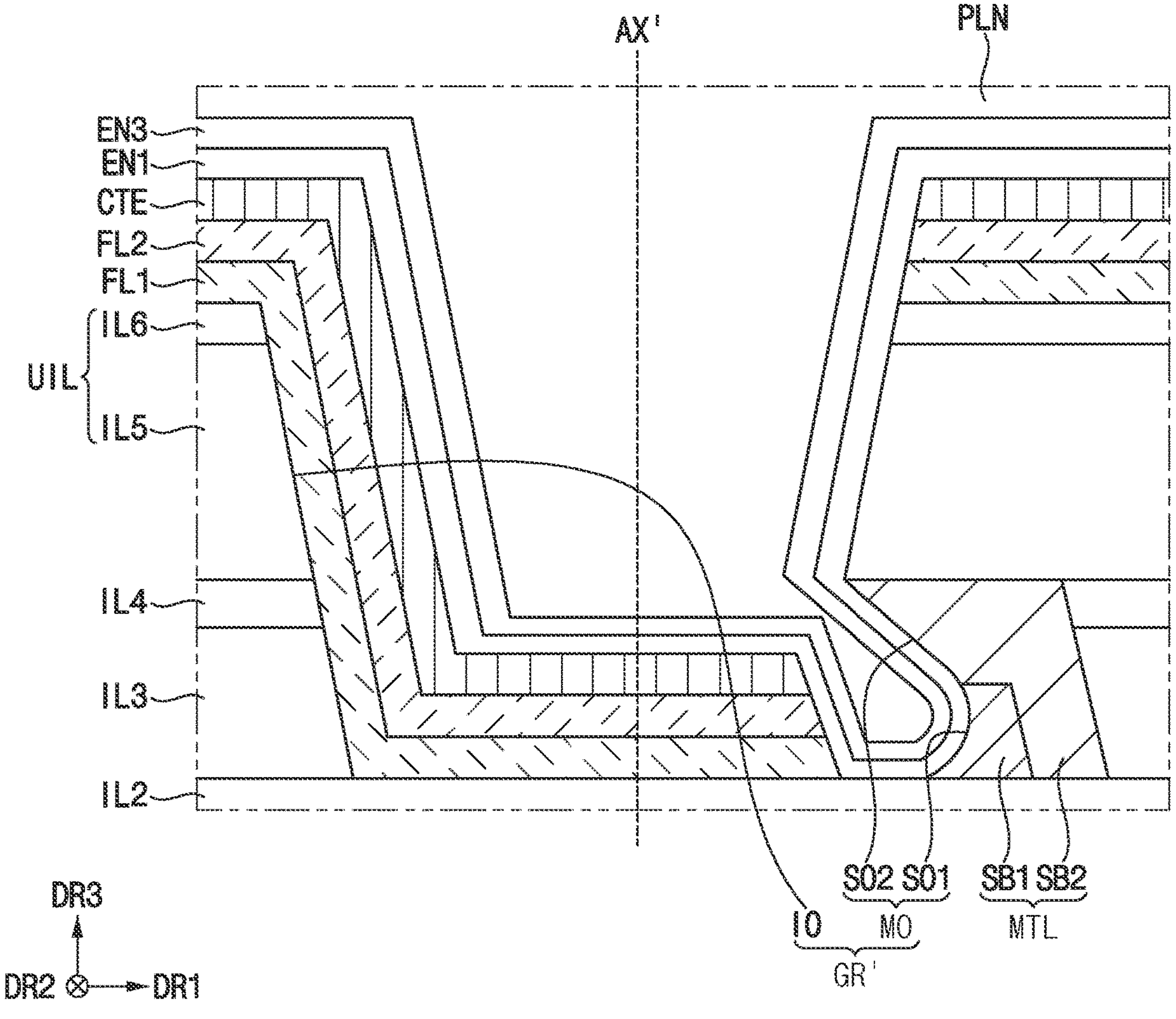
FIG. 14 illustrates a display device according to another embodiment.

FIG. 14 is a view of a display device according to another embodiment. FIG. 14 may correspond to an enlarged view of FIG. 6 according to another embodiment.

Referring to FIG. 14, a display device according to another embodiment may be substantially same as the display device DD described with reference to FIGS. 1 to 6 except for a groove GR'. Therefore, redundant descriptions are omitted.

As shown in FIG. 14, in an embodiment, the groove GR' may be asymmetrical with respect to a central axis AX' of the groove GR'. The central axis AX' may be an imaginary line passing through the center of the groove GR' and extending in the third direction DR3.

For example, when a portion of the metal layer MTL is removed, areas of the metal layer MTL exposed from the upper insulating layer UIL may be adjusted so that the metal opening MO is asymmetric with respect to the central axis AX'. Accordingly, the groove GR' may be formed asymmetrically with respect to the central axis AX'.

In an embodiment, the metal opening MO may be defined by an inner surface of the metal layer MTL, an inner surface of the third insulating layers IL3, and an inner surface of the fourth insulating layer IL4, and the inner surface of the third insulating layer IL3 and the inner surface of the fourth insulating layer IL4 may be aligned with and an inner surface of the upper insulating layer UIL on a straight line. However, the present disclosure is not limited thereto.

In such an embodiment, the groove GR' may have an undercut structure by the metal layer MTL on one side with respect to the central axis AX' and may not have an undercut structure on the other side. However, the present disclosure is not limited thereto, and in another example, the groove GR' may have an undercut structure having a different shape on both sides (e.g., on opposite sides) of the central axis AX'.

Figure 15:
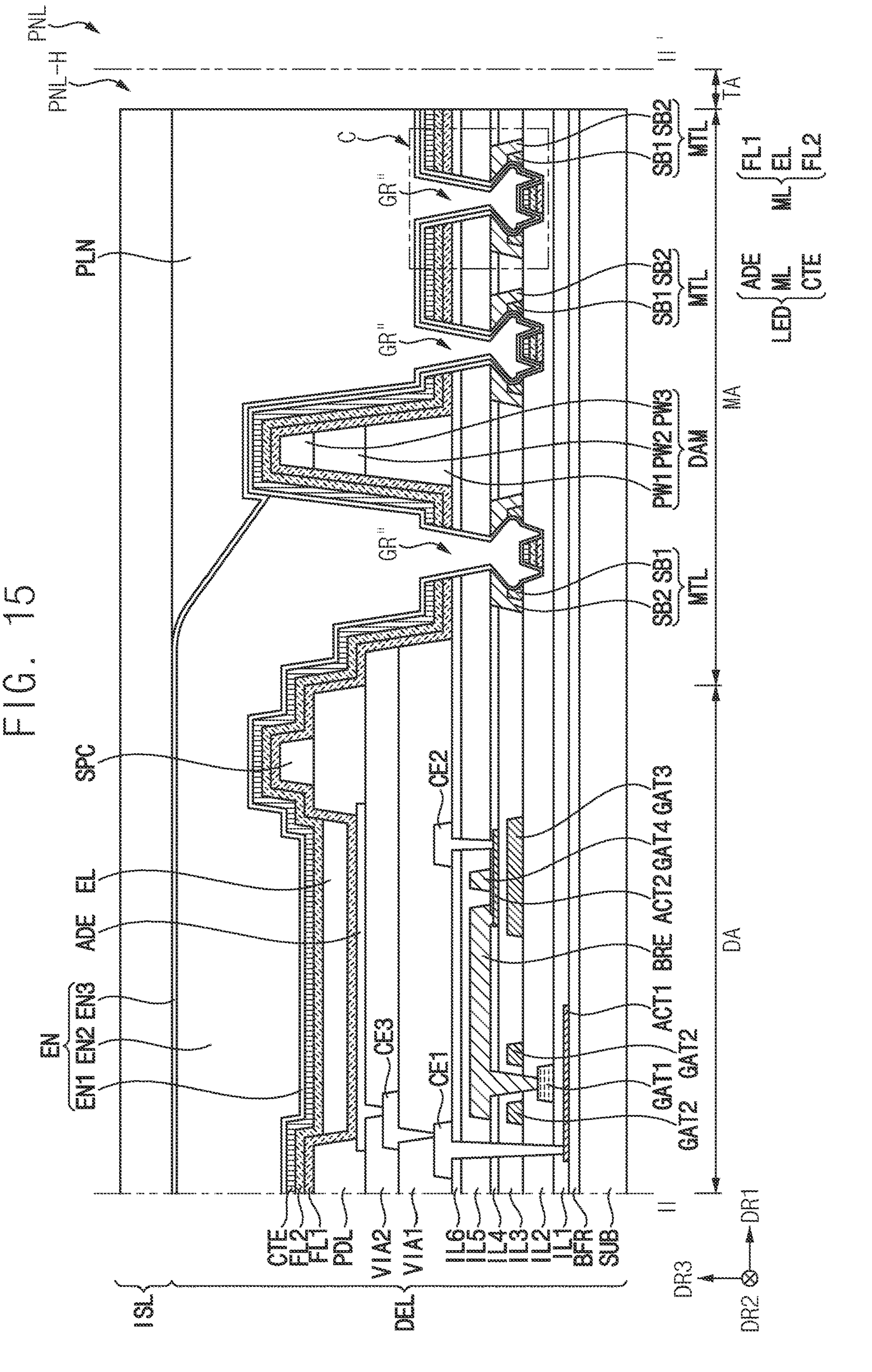
FIGS. 15 and 16 illustrate a display device according to another embodiment.
Figure 16:
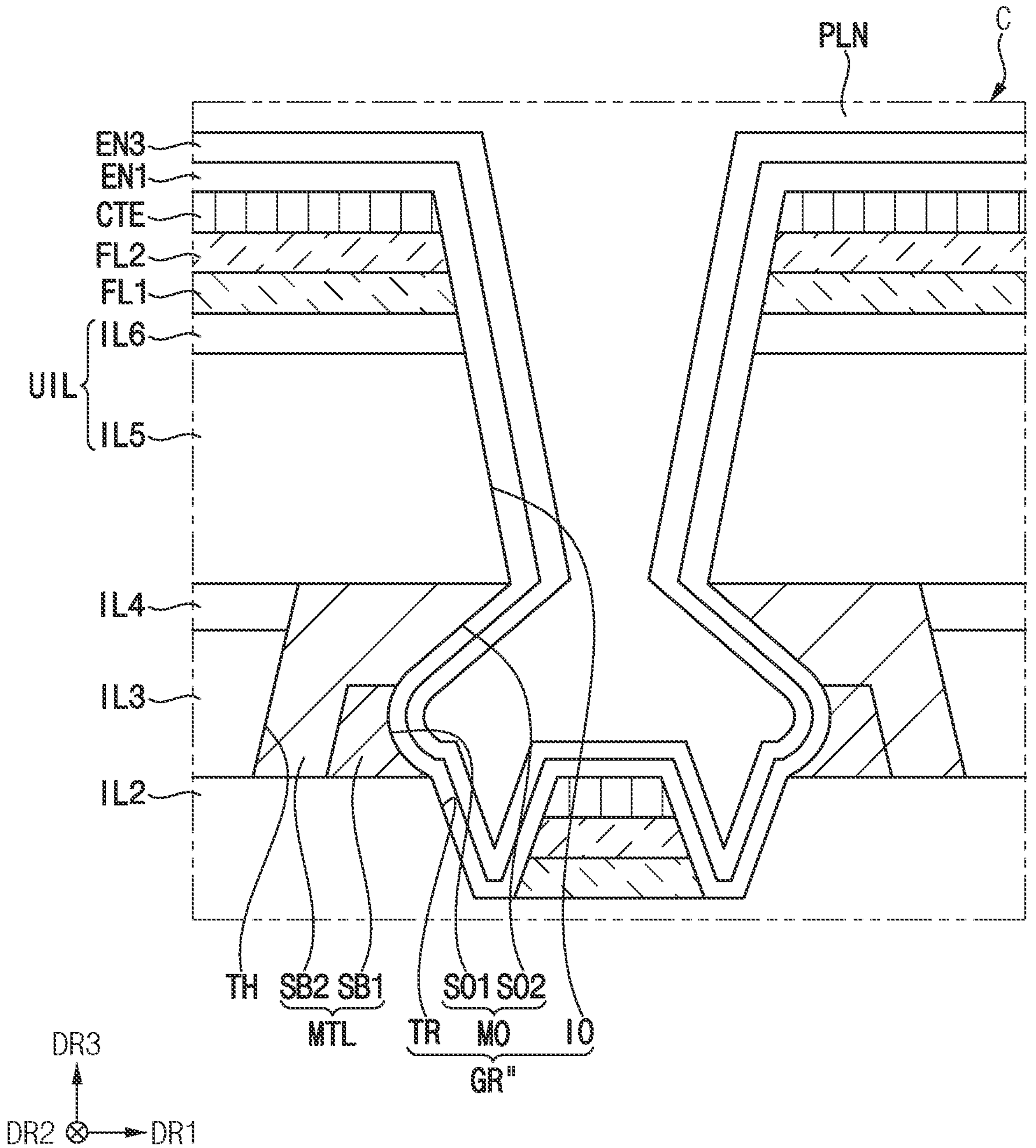

FIGS. 15 and 16 are views illustrating a display device according to another embodiment. FIG. 16 may be an enlarged view illustrating the area C of FIG. 15. For context, FIG. 15 may correspond to a cross-sectional view of FIG. 5 and FIG. 16 may correspond to an enlarged view of FIG. 6 according to different embodiments.

Referring to FIGS. 15 and 16, a display device according to another embodiment may be substantially same as the display device DD described with reference to FIGS. 1 to 6 except for the groove GR". Therefore, redundant descriptions are omitted.

As shown in FIGS. 15 and 16, in one embodiment, the groove GR" may further include a trench TR. The trench TR may pass through (e.g., may extend into) an upper surface of the lower insulating layer disposed under the metal layer MTL. For example, the lower insulating layer may refer to the second insulating layer IL2. The trench TR may be connected to (or may be open to) the metal opening MO. That is, the interconnected insulating opening IO, the metal opening MO, and the trench TR may define the groove GR".

For example, as shown in FIGS. 11 and 12, after the insulating opening IO and the metal opening MO are formed, the second insulating layer IL2 exposed by the metal opening MO may be removed to form a trench TR through an additional process. Accordingly, the groove GR" including the insulating opening IO, the metal opening MO, and the trench TR may be formed.

According to the embodiment, because the groove GR" further includes the trench TR, the depth of the groove GR" may increase (e.g., may be greater than the groove GR and GR'). Accordingly, structural reliability of the display device may be further improved.

Figure 17:
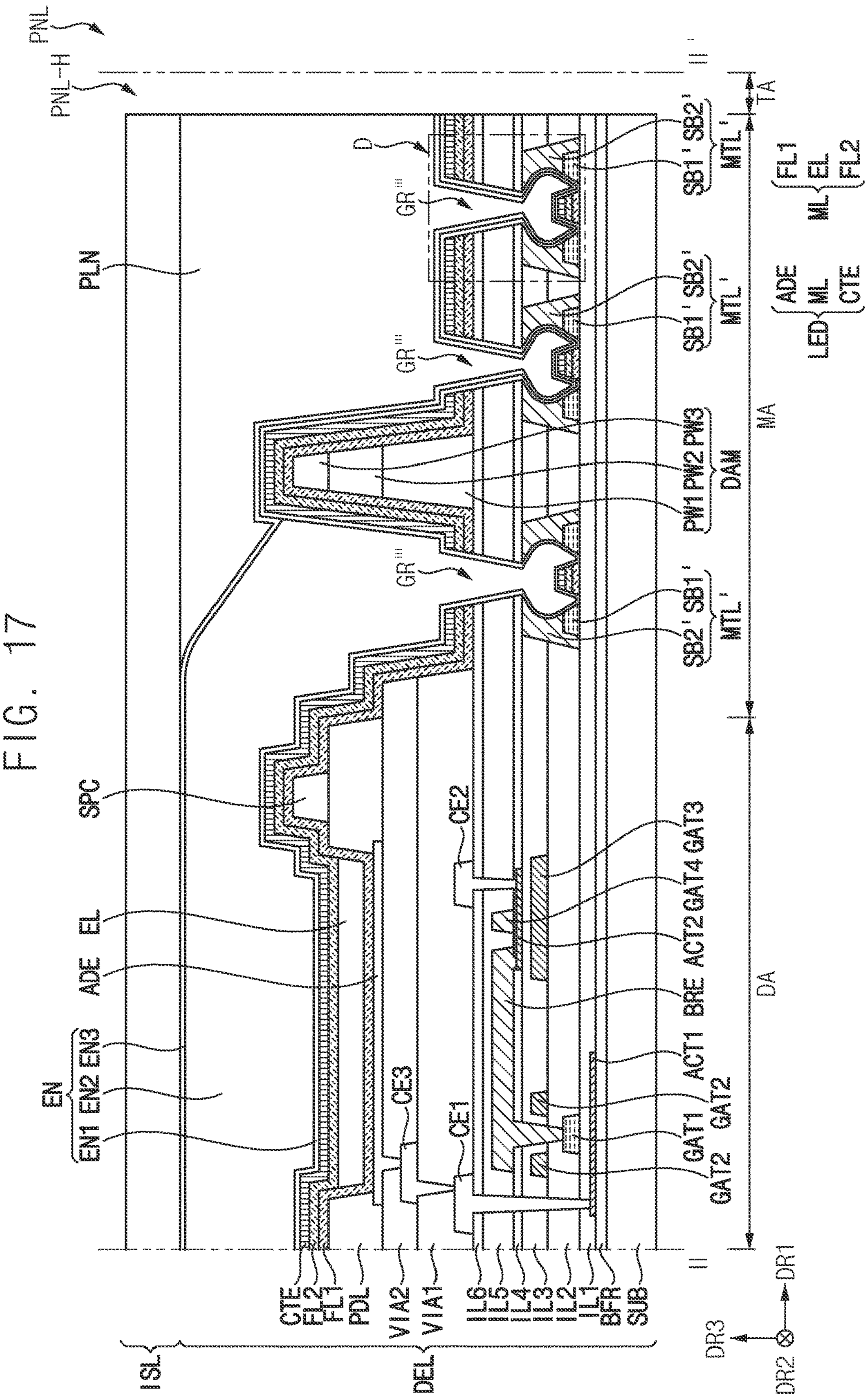
FIGS. 17 and 18 illustrate a display device according to another embodiment.
Figure 18:
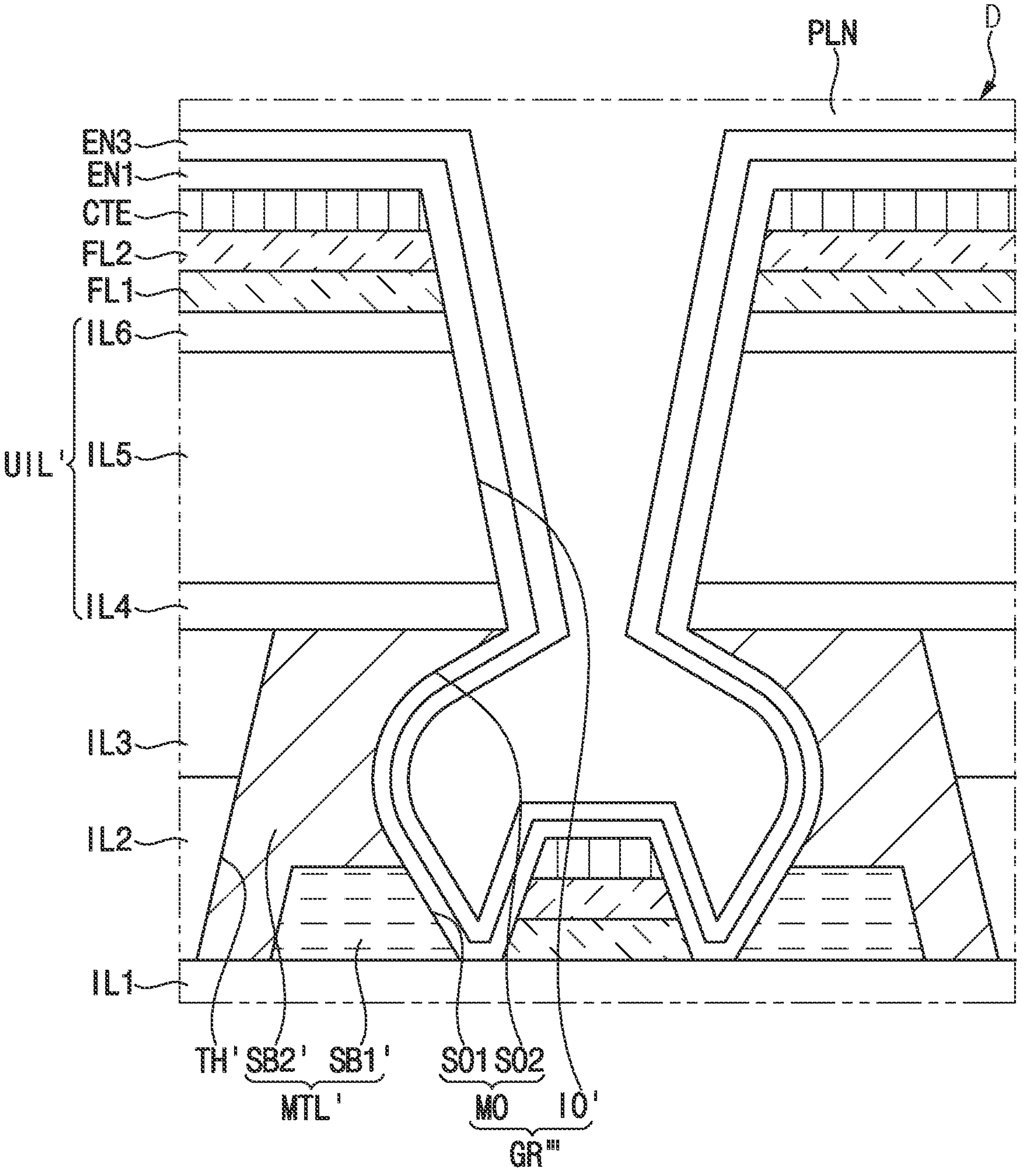

FIGS. 17 and 18 are views illustrating a display device according to another embodiment. FIG. 18 may be an enlarged view of the area D of FIG. 17. For context, FIG. 17 may correspond to a cross-sectional view of FIG. 5 and FIG. 18 may correspond to an enlarged view of FIG. 6 according to different embodiments.

Referring to FIGS. 17 and 18, the display device according to another embodiment may be substantially same as the display device DD described with reference to FIGS. 1 to 6 except for a metal layer MTL' and a groove GR'''. Therefore, redundant descriptions are omitted.

As shown in FIGS. 17 and 18, in an embodiment, the groove GR''' may include the metal opening MO of the metal layer MTL' and an insulating opening IO' of the upper insulating layer UIL disposed on the metal layer MTL'. The upper insulating layer UIL' may include the fourth insulating layer IL4, the fifth insulating layer IL5, and the sixth insulating layer IL6. That is, the groove GR''' may be defined by interconnecting the metal opening MO and the insulating opening IO'.

The metal layer MTL' may have a two-layer structure in which a first sub-layer SB1' and a second sub-layer SB2' are sequentially stacked. Each of the first sub-layer SB1' and the second sub-layer SB2' may have an opening defining the metal opening MO. The first sub-layer SB1' may have the first sub-opening SO1, and the second sub-layer SB2' may have the second sub-opening SO2 connected to the first sub-opening SO1. That is, the metal opening MO may be defined by interconnecting the first sub-opening SO1 and the second sub-opening SO2.

In an embodiment, the first sub-layer SB1' and the first conductive layer (e.g., the first gate electrode GAT1) may be formed together in a same process. In other words, the first sub-layer SB1' may include a same material as the first conductive layer. For example, the first sub-layer SB1' may be disposed on a same layer as the first conductive layer. Specifically, the first sub-layer SB1' may be disposed on the first insulating layer IL1.

For example, the first sub-layer SB1' and the first conductive layer may be formed in a same process by applying a preliminary conductive layer on the first insulating layer IL1 and selectively removing areas of the preliminary conductive layer other than areas corresponding to the first sub-layer SB1' and the first conductive layer.

Examples of materials that can be used as the first sub-layer SB1' may include silver (Ag), an alloy containing silver, molybdenum (Mo), an alloy containing molybdenum, aluminum (Al), an alloy containing aluminum, and aluminum Nitride (AlN), Tungsten (W), Tungsten Nitride (WN), Copper (Cu), Nickel (Ni), Chromium (Cr), Chromium Nitride (CrN), Titanium (Ti), Tantalum (Ta), Platinum (Pt)), scandium (Sc), indium tin oxide (ITO), indium zinc oxide (IZO), or the like. These may be used alone or in combination with each other.

In an embodiment, the second sub-layer SB2' and the third conductive layer (e.g., the fourth gate electrode GAT4 and the bridge electrode BRE) may be formed together in a same process. In other words, the second sub-layer SB2' may include a same material as the third conductive layer.

For example, the second sub-layer SB2' and the third conductive layer may be formed in a same process by forming a through hole TH' penetrating the second insulating layer IL2 and the third insulating layer IL3, applying a preliminary conductive layer on the first insulating layer IL1 and the third insulating layer IL3, and selectively removing areas of the preliminary conductive layer other than areas corresponding to the second sub-layer SB2' and the third conductive layer.

The through hole TH' may be formed together with contact holes for contacting the bridge electrode BRE with the first gate electrode GAT1 and the second active pattern ACT2 in a same process.

Accordingly, the metal layer MTL' may be disposed inside the through hole TH' penetrating the second insulating layer IL2 and the third insulating layer IL3. Although an edge of the upper surface of the metal layer MTL' coincides with an edge of an upper surface of the third insulating layer IL3, and an edge of a lower surface of the metal layer MTL' coincides with an edge of a lower surface of the second insulating layer IL2 in FIGS. 17 and 18, the present disclosure is not limited thereto. In another embodiment, the metal layer MTL' may have various structures disposed inside the through hole TH' penetrating the second insulating layer IL2 and the third insulating layer IL3.

Examples of materials that can be used as the second sub-layer SB2' may include silver (Ag), an alloy containing silver, molybdenum (Mo), an alloy containing molybdenum, aluminum (Al), an alloy containing aluminum, and aluminum Nitride (AlN), Tungsten (W), Tungsten Nitride (WN), Copper (Cu), Nickel (Ni), Chromium (Cr), Chromium Nitride (CrN), Titanium (Ti), Tantalum (Ta), Platinum (Pt), scandium (Sc), indium tin oxide (ITO), indium zinc oxide (IZO), or the like. These may be used alone or in combination with each other.

The present disclosure should not be construed as being limited to the embodiments set forth herein. Rather, these embodiments are provided so that this disclosure will be thorough and complete and will fully convey the present disclosure to those skilled in the art.

While the present disclosure has been shown and described with reference to embodiments thereof, it will be understood by those of ordinary skill in the art that various changes in form and details may be made therein without departing from the spirit or scope of the present disclosure as defined by the following claims and their equivalents.

What is claimed is:

1. A display device comprising:

a substrate having a transmission area, a display area extending around a periphery of the transmission area, and an intermediate area between the transmission area and the display area;

a first active layer on the substrate and comprising a first active pattern in the display area;

a first conductive layer on the first active layer and comprising a gate electrode overlapping the first active pattern;

a second active layer on the first conductive layer and comprising a second active pattern in the display area;

a second conductive layer between the first conductive layer and the second active layer;

a third conductive layer on the second conductive layer and comprising a bridge electrode electrically connecting the gate electrode and the second active pattern;

a first sub-layer in the intermediate area and on a same layer as the second conductive layer, the first sub-layer having a first sub-opening; and a second sub-layer in the intermediate area and covering an outer surface of the first sub-layer, the second sub-layer having a second sub-opening connected to the first sub-opening, wherein a slope of sidewalls of the first sub-layer and the second sub-layer, which are connected to each other, varies continuously inwardly toward a center of the second sub-opening in a direction away from the substrate.

2. The display device of claim 1, further comprising an upper insulating layer on the third conductive layer and the second sub-layer and covering the bridge electrode, wherein the first sub-opening and the second sub-opening are interconnected to define a metal opening, and wherein the upper insulating layer has an insulating opening connected to the metal opening.

3. The display device of claim 2, wherein the metal opening and the insulating opening are interconnected to define a groove, and wherein an inner surface of the metal opening is more recessed in a direction away from a center of the groove than an inner surface of the insulating opening.

4. The display device of claim 3, further comprising a lower insulating layer under the second conductive layer and the first sub-layer, the lower insulating layer having a trench connected to the metal opening such that the groove further comprises the trench.

5. The display device of claim 3, wherein the groove is axisymmetric with respect to a central axis of the groove.

6. The display device of claim 3, wherein the groove is asymmetrical with respect to a central axis of the groove.

7. The display device of claim 3, further comprising a light emitting device in the display area and comprising an anode electrode, a cathode electrode, and an intermediate layer between the anode electrode and the cathode electrode, wherein the cathode electrode is disconnected by the groove.

8. The display device of claim 7, wherein the intermediate layer comprises an emission layer, a first functional layer between the anode electrode and the emission layer, and a second functional layer between the emission layer and the cathode electrode, and wherein at least one of the first functional layer and the second functional layer is disconnected by the groove.

9. The display device of claim 1, wherein the first active pattern comprises a silicon semiconductor, and wherein the second active pattern comprises an oxide semiconductor.

10. The display device of claim 1, wherein the second conductive layer and the first sub-layer comprise a same material, and wherein the third conductive layer and the second sub-layer comprise a same material.

11. The display device of claim 1, further comprising:

a fourth conductive layer on the third conductive layer and comprising a first connection electrode contacting the first active pattern and a second connection electrode contacting the second active pattern; and a fifth conductive layer on the fourth conductive layer and comprising a third connection electrode contacting the first connection electrode.

12. The display device of claim 1, wherein the first conductive layer and the first sub-layer comprise a same material, and wherein the third conductive layer and the second sub-layer comprise a same material.

13. A display device comprising:

a substrate having a transmission area, a display area extending around a periphery of the transmission area, and an intermediate area between the transmission area and the display area;

a first active layer on the substrate and comprising a first active pattern in the display area;

a first conductive layer on the first active layer and comprising a gate electrode overlapping the first active pattern;

a second active layer on the first conductive layer and comprising a second active pattern in the display area;

a second conductive layer between the first conductive layer and the second active layer;

a third conductive layer on the second conductive layer and comprising a bridge electrode electrically connecting the gate electrode and the second active pattern;

a first sub-layer in the intermediate area and on a same layer as the first conductive layer, the first sub-layer having a first sub-opening; and a second sub-layer in the intermediate area and covering an outer surface of the first sub-layer, the second sub-layer having a second sub-opening connected to the first sub-opening, wherein a slope of sidewalls of the first sub-layer and the second sub-layer, which are connected to each other, varies continuously inwardly toward a center of the second sub-opening in a direction away from the substrate.

14. The display device of claim 13, further comprising an upper insulating layer on the third conductive layer and the second sub-layer and covering the bridge electrode, wherein the first sub-opening and the second sub-opening are interconnected to define a metal opening, and wherein the upper insulating layer has an insulating opening connected to the metal opening.

15. The display device of claim 14, wherein the metal opening and the insulating opening are interconnected to define a groove, and wherein an inner surface of the metal opening is more recessed in a direction away from a center of the groove than an inner surface of the insulating opening.

16. A method of manufacturing a display device, the method comprising:

forming a first active layer comprising a first active pattern in a display area of a substrate, the substrate having a transmission area, the display area extending around a periphery of the transmission area, and an intermediate area between the transmission area and the display area;

forming a first conductive layer comprising a gate electrode overlapping the first active pattern on the first active layer;

forming a second active layer on the first conductive layer and comprising a second active pattern;

forming a second conductive layer between the first conductive layer and the second active layer;

forming a third conductive layer on the second conductive layer and comprising a bridge electrode electrically connecting the gate electrode and the second active pattern;

forming a first sub-layer in the intermediate area and on the first active layer;

forming a second sub-layer in the intermediate area and covering an outer surface of the first sub-layer;

forming an upper insulating layer having an insulating opening exposing a portion of the second sub-layer on the third conductive layer and the second sub-layer;

exposing a portion of the first sub-layer by removing the second sub-layer exposed from the upper insulating layer; and removing the first sub-layer exposed from the second sub-layer, wherein the forming of the second sub-layer and the forming of the third conductive layer are concurrently performed in a same process.

17. The method of claim 16, wherein the forming of the first sub-layer is performed together with any one of the forming of the second conductive layer and the forming of the second conductive layer.

18. The method of claim 16, wherein, during the removing the first sub-layer, a portion of the second sub-layer is removed together therewith.

19. The method of claim 16, further comprising:

forming a fourth conductive layer on the third conductive layer and comprising a first connection electrode contacting the first active pattern and a second connection electrode contacting the second active pattern;

forming a fifth conductive layer on the fourth conductive layer and comprising a third connection electrode contacting the first connection electrode; and forming an anode electrode on the fifth conductive layer and contacting the third connection electrode, wherein the forming of the fourth conductive layer, the forming of the fifth conductive layer, and the forming of the anode electrode are performed after the forming of the upper insulating layer.

20. The method of claim 19, wherein the forming of the fourth conductive layer comprises:

forming a first preliminary conductive layer on the upper insulating layer; and removing a portion of the first preliminary conductive layer, and wherein the removing of the second sub-layer is performed together with the removing of the portion of the first preliminary conductive layer.

21. The method of claim 20, wherein the removing of the portion of the first preliminary conductive layer is performed by a dry etching process.

22. The method of claim 19, wherein the forming of the fifth conductive layer comprises:

forming a second preliminary conductive layer on the upper insulating layer; and removing a portion of the second preliminary conductive layer, and wherein the removing of the second sub-layer is performed together with the removing of the portion of the second preliminary conductive layer.

23. The method of claim 22, wherein the removing of the portion of the second preliminary conductive layer is performed by a dry etching process.

24. The method of claim 19, wherein the forming of the anode electrode comprises:

forming a third preliminary conductive layer on the upper insulating layer; and removing a portion of the third preliminary conductive layer, and wherein the removing of the first sub-layer is performed together with the removing of the portion of the third preliminary conductive layer.

25. The method of claim 24, wherein the removing of the portion of the third preliminary conductive layer is performed by a wet etching process.

26. The method of claim 16, wherein, after the removing of the first sub-layer:

the first sub-layer has a first sub-opening, the second sub-layer has a second sub-opening connected to the first sub- opening, the first sub-opening and the second sub-opening are interconnected to define a metal opening, and the metal opening and the insulating opening are interconnected to define a groove.

27. The method of claim 26, further comprising forming a trench connected to the metal opening by removing a portion of a lower insulating layer under the first sub-layer, wherein the forming of the trench is performed after the removing of the first sub-layer.

* * * * *